United States Patent
Nomura et al.

(10) Patent No.: US 6,897,536 B2
(45) Date of Patent: May 24, 2005

(54) ESD PROTECTION CIRCUIT

(75) Inventors: Toshio Nomura, Kawasaki (JP); Teruo Suzuki, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/441,216

(22) Filed: May 20, 2003

(65) Prior Publication Data

US 2003/0227053 A1 Dec. 11, 2003

(30) Foreign Application Priority Data

Jun. 11, 2002 (JP) ........................................ 2002-170150

(51) Int. Cl.[7] .............................................. H01L 29/76
(52) U.S. Cl. .................... 257/403; 257/344; 257/403; 257/414; 257/408; 257/409; 257/548; 257/549
(58) Field of Search ................................ 257/344, 403, 257/404, 408, 409, 548, 549

(56) References Cited

U.S. PATENT DOCUMENTS

| | | | |
|---|---|---|---|
| 6,198,142 B1 | * | 3/2001 | Chau et al. ................. 257/408 |
| 6,218,226 B1 | | 4/2001 | Lin et al. |
| 6,388,288 B1 | * | 5/2002 | Vasanth et al. ............. 257/344 |
| 6,426,535 B1 | * | 7/2002 | Takeuchi et al. ............ 257/408 |
| 6,452,232 B1 | * | 9/2002 | Adan .......................... 257/347 |
| 6,674,127 B2 | * | 1/2004 | Kotani ......................... 257/347 |

FOREIGN PATENT DOCUMENTS

CN   436903   5/2001

* cited by examiner

*Primary Examiner*—Allan R. Wilson
*Assistant Examiner*—Edgardo Ortiz
(74) *Attorney, Agent, or Firm*—Westerman Hattori Daniels & Adrian, LLP

(57) ABSTRACT

An ESD-protection device includes a gate electrode formed on a substrate; a first diffusion region of a first conductivity type formed in the substrate at a first side of the gate electrode, a second diffusion region of the first conductivity type formed in the substrate at a second side of the gate electrode, and a third diffusion region of a second conductivity type formed in the substrate underneath the second diffusion region in contact with the second diffusion region. Thereby, the impurity concentration level of the third diffusion region is set to be larger than the impurity concentration level of the region of the substrate located at the same depth right underneath the gate electrode.

16 Claims, 24 Drawing Sheets

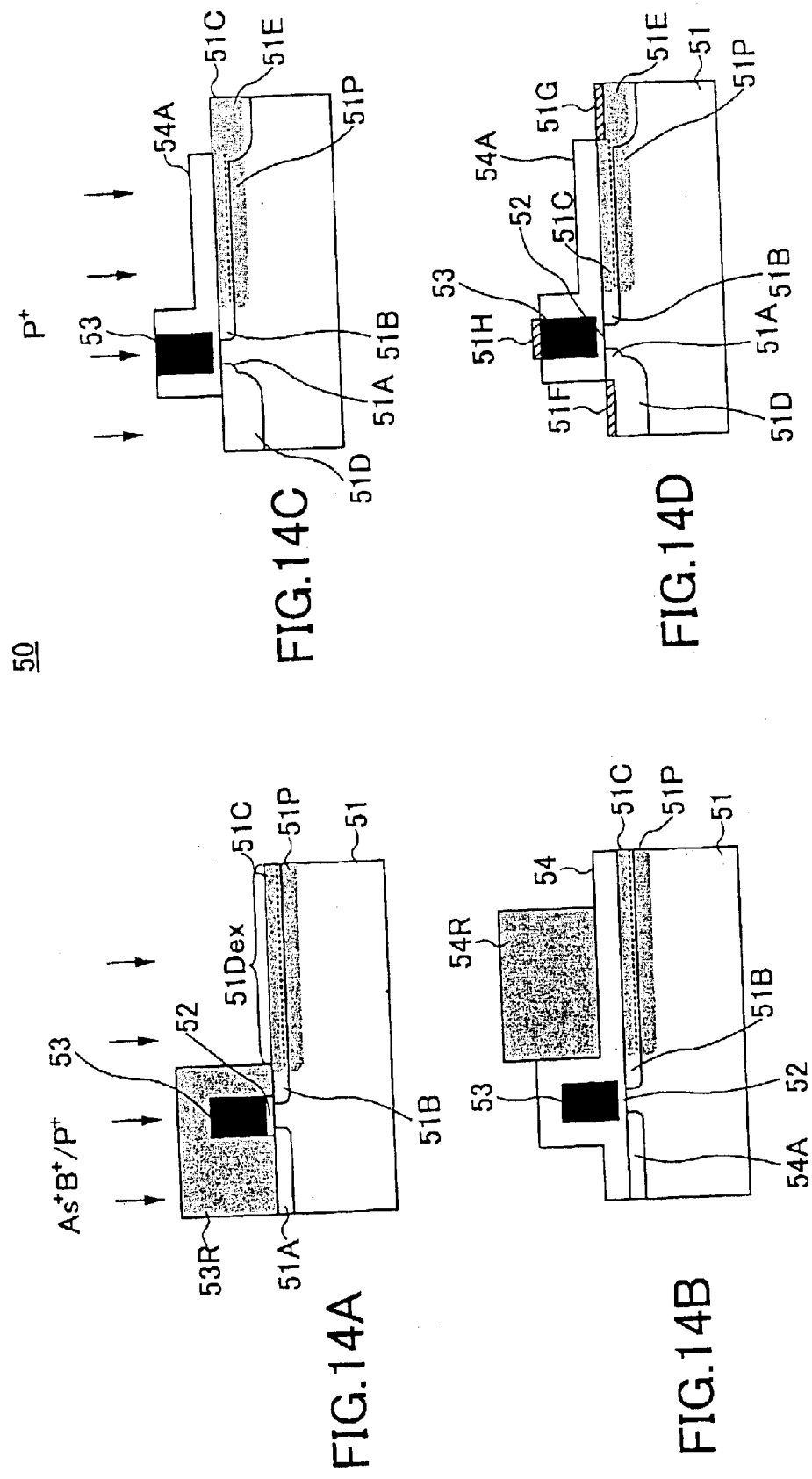

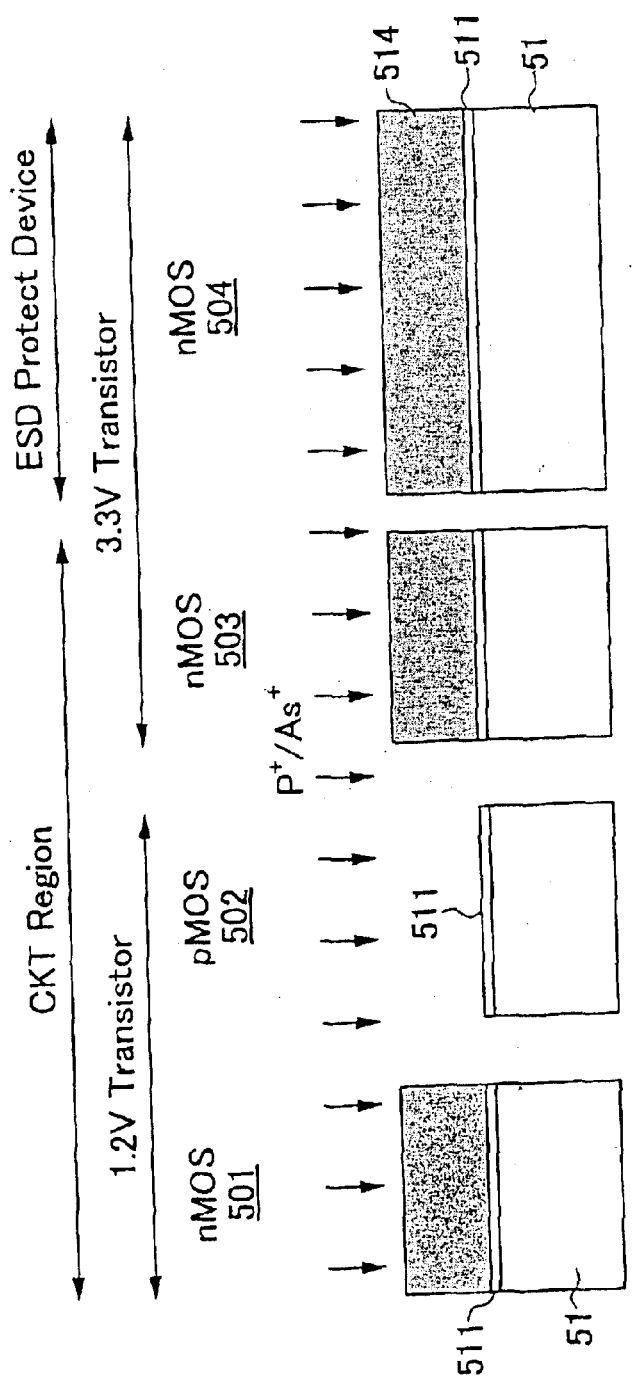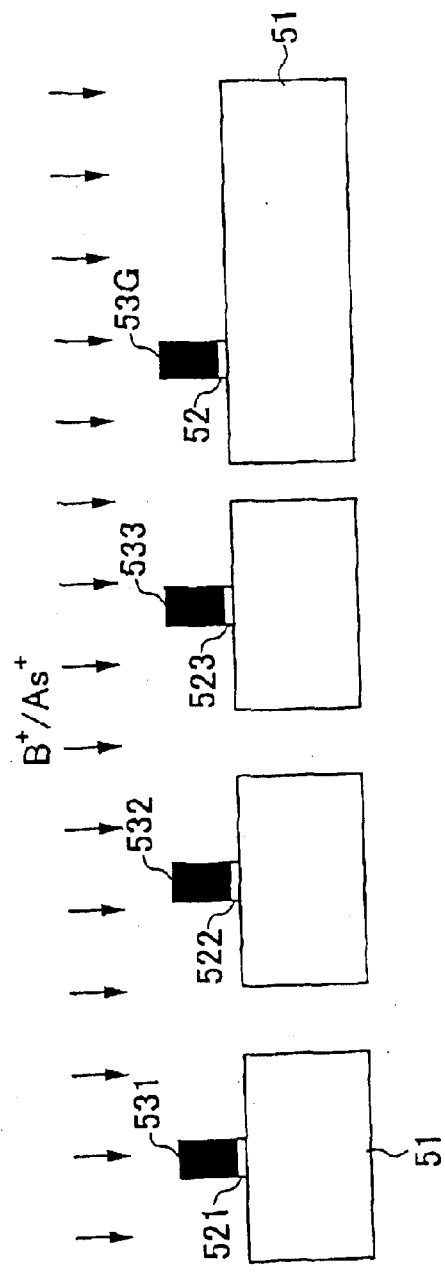
FIG.16C
FIG.16D

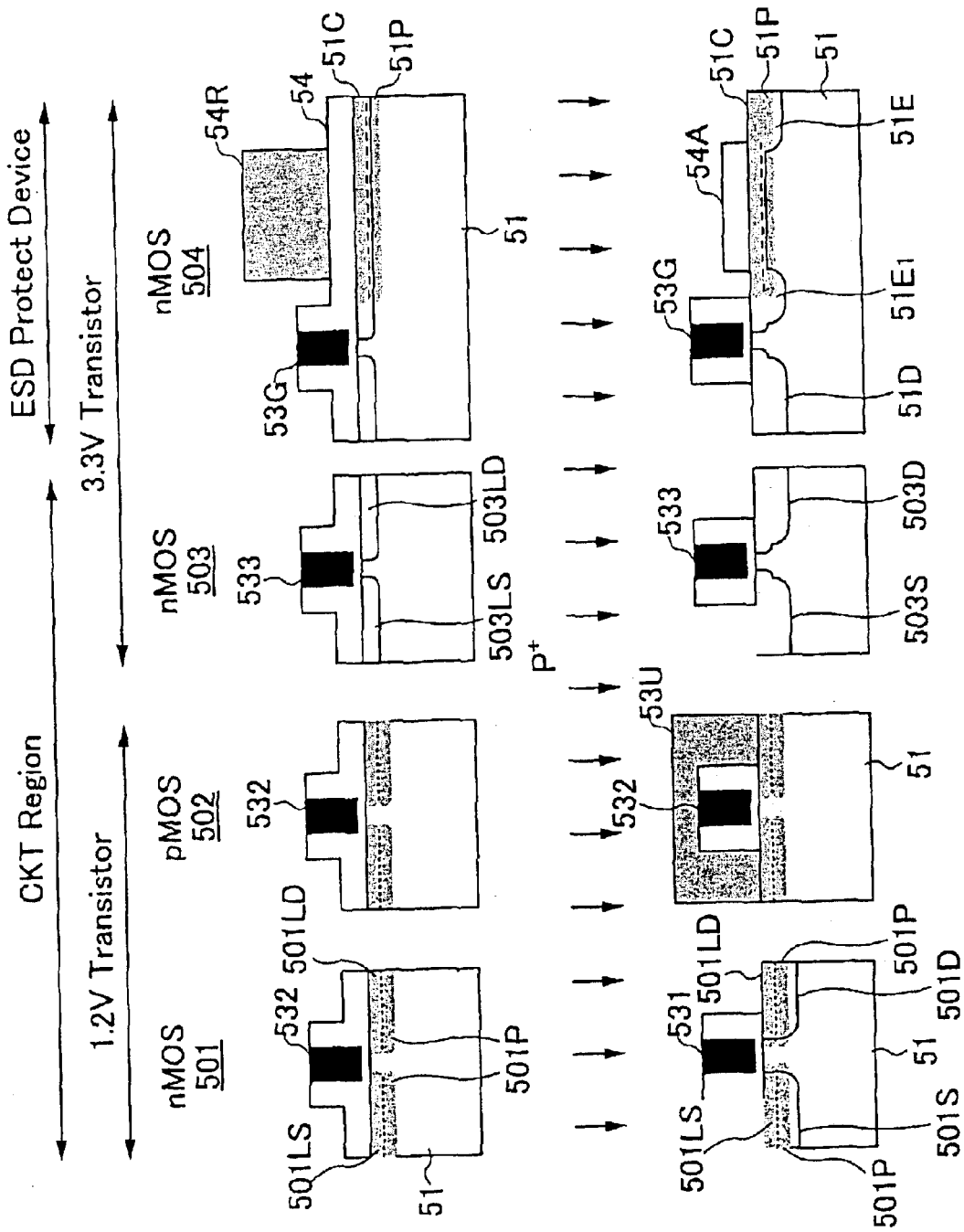

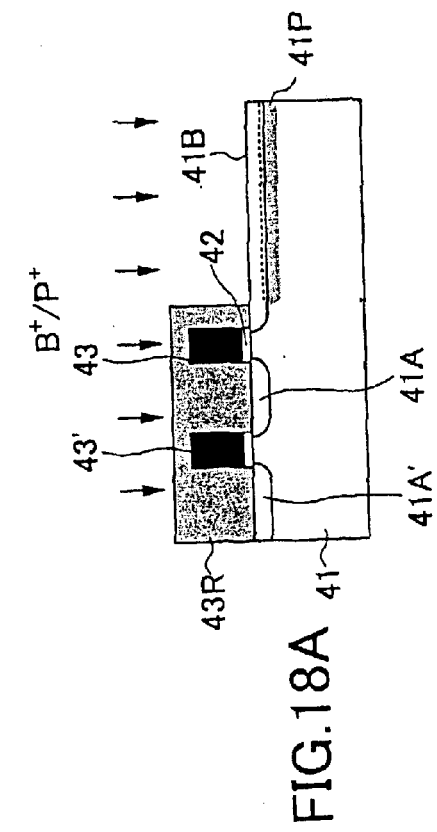
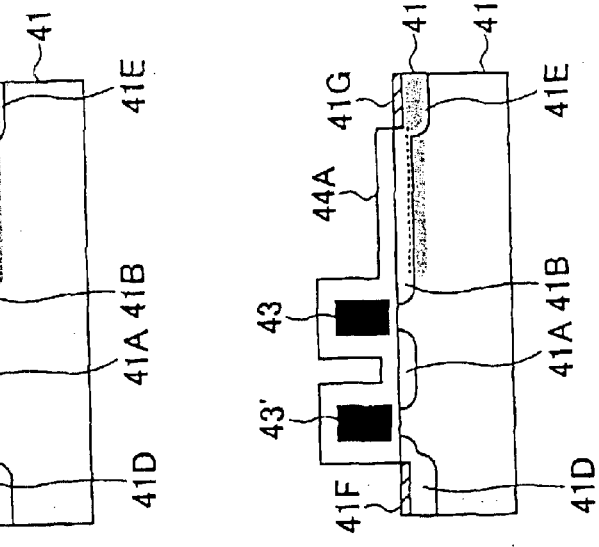
FIG.18A  FIG.18B  FIG.18C  FIG.18D

US 6,897,536 B2

ESD PROTECTION CIRCUIT

CROSS-REFERENCE TO RELATED APPLICATION

The present application is based on Japanese priority application No. 2002-170150 filed on Jun. 11, 2002, the entire contents of which are hereby incorporated by reference.

BACKGROUND OF THE INVENTION

The present invention generally relates to semiconductor devices and more particularly to a semiconductor device having an improved ESD robustness and a fabrication process thereof.

A semiconductor integrated circuit device generally includes a protection circuit for protecting minute semiconductor elements formed therein from a voltage surge such as the one caused by external electric discharge (ESD).

Because it is preferable to form such a protection circuit with a process similar to the one used for fabricating the semiconductor elements inside the semiconductor integrated circuit device, the protection circuit generally has a construction similar to that of the semiconductor element formed inside the semiconductor integrated circuit device. Further, it is preferable that such a semiconductor element constituting the protection circuit can be used also for an input/output circuit of the semiconductor integrated circuit at the same time.

While there are various ESD protection circuits of different constructions such as the one using a diode or the one using a transistor, FIG. 1 shows an example of a conventional ESD protection circuit 10 that uses a MOS transistor, which constitutes also an input/output circuit. Further, FIG. 2 shows an equivalent circuit diagram of the protection circuit 10 of FIG. 1.

Referring to FIG. 1, the ESD protection circuit 10 includes an n-channel MOS transistor 10A formed on a Si substrate 11 of p--type, wherein the MOS transistor 10A includes a gate electrode 13 provided on the Si substrate 11 in the state that a gate insulation film 12 is provided between the gate electrode 13 and the Si substrate 11, wherein the Si substrate 11 is further formed with LDD regions 11A and 11B of n--type at both lateral sides of the gate electrode 13. Further, the Si substrate 11 is formed with diffusion regions 11C and 11D of n+-type formed respectively at further outer sides of the foregoing LDD regions 11A and 11B. Further, sidewall insulation films 13A and 13B are formed at respective lateral sidewall surfaces of the gate electrode 13, and silicide regions 14A and 14B are formed on the surface of the diffusion regions 11C and 11D at respective outer sides of the sidewall insulation films 13A and 13B.

Referring to FIG. 2, the n-channel MOS transistor constitutes a CMOS circuit provided between a power supply line Vdd and a power supply line Vss together with another p-channel MOS transistor having a similar construction, wherein it can be seen that the silicide region 14B of the transistor 10A is connected to an input/output pad 10P.

In the ESD protection circuit 10 of such a construction, the transistors 10A and 10B form an ordinary input/output circuit. Thus, when there comes in a voltage surge to the input/output pad 10P by an ESD or the like in the state the voltage level of the source diffusion region 11C and the voltage level of the gate electrode 13 are set to zero volt, there is caused an increase of voltage level in the diffusion region 11D, and there are formed electron-hole pairs as a result of large potential gradient formed between the n+-type drain region 11D and the substrate 11 of p--type. Thereby, the holes thus formed are caused to flow to the Si substrate 11 in the form of a hole current Ibh1.

Because of the fact that the Si substrate 11 has a finite resistance, such a discharge current Ibh1 induces an increase of voltage level in the interior of the substrate 11, and as a result, there is caused conduction in a parasitic lateral bipolar transistor, which is formed in the Si substrate 11 by the p-type region 11, n+-type diffusion region 11C and the n+-type diffusion region 11D. Thereby, a large current is caused to flow in the substrate 11 between the diffusion region 11C and the diffusion region 11D as represented in FIG. 1 by an arrow, and the voltage surge is successfully relieved.

FIG. 3 shows the construction of an ESD-protection input/output circuit designed based on the circuitry of FIGS. 1 and 2 for use in an actual semiconductor integrated circuit, wherein those parts corresponding to the parts described previously are designated by the same reference numerals and the description thereof will be omitted.

Referring to FIG. 3, the polysilicon gate electrode 13 has a number of fingers $13_1$–$13_5$ extending on the surface of the Si substrate 11, wherein it should be noted that the electrode fingers $13_1$–$13_5$ extend over an active region 11Ac, defined on the Si substrate 11 by the device isolation film 11S, in a mutually parallel relationship. Thereby, the n-channel MOS transistor 10 of FIG. 1 is formed in each of the fingers $13_1$–$13_5$.

In the construction of FIG. 3, it should further be noted that the drain diffusion region 11D of each MOS transistor 10 is connected to the pad electrode 10P via an interconnection pattern 15. Further, the source diffusion region 11C is connected to the power supply line Vss via the interconnection pattern 16.

By constructing the gate electrode in the form having a large number of branches or fingers, a large number of transistors are connected parallel as represented in FIG. 4, and the ESD protection circuit can handle a large discharge current.

Referring to FIG. 4, it can be seen that, in each of the fingers, the MOS transistor 10A forming the ESD-protection circuit of FIG. 1 is connected to any of the resistors R1–R3 in series connection. According to such a construction, the common node A does not undergo a significant voltage drop even when there has been caused a conduction in any one of the fingers, and thus, the problem of concentration of the discharge current to a particular finger that has caused the conduction first is successfully avoided.

Thus, in the construction having such a ballast resistors, it becomes possible to cause the turning-on of the transistor 10A in all of the fingers in the event of electric surge, and effective protection operation via efficient electric discharge is guaranteed.

Meanwhile, modern, highly miniaturized semiconductor devices achieve improvement of operational speed by forming very thin silicide layers such as the one represented by layers 14A and 14B on the surface of the diffusion regions 11C and 11D as represented in FIG. 1 for reducing the resistance. Thus, in such a structure that uses silicide layers, it is possible to form the ballast resistors R1–R4 of FIG. 4 by merely restricting the area of silicide formation in the vicinity of the channel region, in other words, by forming a silicide block region in which there occurs no silicide formation.

FIG. 5 shows an example of realizing the ballast resistors R1–R5 of FIG. 4 by way of such a silicide block region SBL. In FIG. 5, it should be noted that those parts corresponding to the parts described previously are designated by the same reference numerals and the description thereof will be omitted.

Referring to FIG. 5, it can be seen that the silicide block region SBL is formed in correspondence to each of the gate electrode fingers $13_1$–$13_5$, wherein the silicide block region SBL suppresses the formation of the silicide layers 14A and 14B as explained before.

In the ESD protection device of such a construction, it should be noted that the silicide block region SBL functions as a resistance against the silicide regions 14A and 14B, and it becomes possible to realize the ballast resistors R1–R3 shown in FIG. 4 by way of the silicide block region SBL. Thus, in the ESD protection device of FIG. 5, all the MOS transistors of the fingers $13_1$–$13_5$ conduct simultaneously upon incoming of the electric surge, and the problem of concentration of discharge current to a particular transistor is successfully avoided.

Meanwhile, with advancement in the art of device miniaturization, the supply voltage used in recent highly miniaturized semiconductor devices has been lowered from the conventional voltage of 5V to 3.3V. On the other hand, there are still many semiconductor devices that use the supply voltage of 5V, and thus, there is a need for a semiconductor integrated circuit, primarily designed for the supply voltage of 3.3V, that the semiconductor integrated circuit can handle also the input/output signals of 5V.

In order to meet for such a demand, there has been proposed an ESD-protection input/output device as represented in FIG. 6 in which the MOS transistor 10A operable at the supply voltage of 3.3V is cascaded with another MOS transistor 10A' of the same construction.

FIG. 7 shows the cross-sectional structure of the ESD-protection input/output device of FIG. 6, wherein it should be noted that those parts corresponding to the parts described previously are designated by the same reference numerals and the description thereof will be omitted.

Referring to FIG. 7, the device of FIG. 6 has a cascaded construction such that the active region 11Ac defined by the device isolation structure 11S includes therein a MOS transistor 10A' having a gate electrode 13' in addition to the MOS transistor 10A in cascade connection, such that the MOS transistor 10A' shares the diffusion region 11D commonly. Further, the MOS transistor 10A' has an n-type diffusion region 11G at a side opposite to the side of the diffusion region 11D. Further, it is noted that LDD regions 11E and 11F of n--type are formed at respective inner side regions of the diffusion regions 11D and 11G.

In the ESD-protection input/output device of FIG. 7, it should be noted that there is formed a lateral npn transistor such that the lateral bipolar transistor includes the p-type substrate 11 as a base, the n-type diffusion region 11C as an emitter, and the n-type diffusion region 11G as a collector, wherein the lateral npn transistor causes conduction when a surge voltage comes in to the diffusion region 11G connected to the pad electrode 10P. When conduction occurs, the excessive electric charges are neutralized and the desired ESD protection operation is achieved.

In recent semiconductor integrated circuits having ultrafine semiconductor elements therein, on the other hand, it is becoming difficult to secure sufficient area on the substrate for such ESD-protection devices due to the increase of integration density and associated increase of number of the electrode pads provided on the substrate.

Thus, in such a case of semiconductor integrated circuit devices including ultrafine semiconductor elements, the transistors constituting the ESD-protection input/output device tend to experience severe local heating even if the ESD-protection input/output device has the structure that uses the ballast resistors such as the one shown in FIG. 4 by using the silicide block structure of FIG. 5. When a transistor is destroyed in any of the fingers, the overall current drive capability is reduced for the ESD-protection input/output circuit, and the ESD-protection input/output device can no longer provide sufficient protection against ESD.

Further, in the case of the cascaded circuit such as the one shown in FIG. 7, it should be noted that there occurs an increase of resistance due to the serial connection of two transistors 10A and 10A' in the discharge current path between the diffusion region 11G and the diffusion region 11C, and the current drivability of the lateral bipolar transistor is degraded. Associated with this, there occurs an increase of heating.

SUMMARY OF THE INVENTION

Accordingly, it is a general object of the present invention to provide a novel and useful semiconductor device wherein the foregoing problems are eliminated.

Another and more specific object of the present invention is to provide an ESD-protection device having improved capability of handling discharge current and a semiconductor device that constitutes such an ESD-protection device.

Another object of the present invention is to provide a semiconductor device comprising:

a substrate;

a source region of a first conductivity type formed in said substrate;

a drain region of said first conductivity type formed in said substrate;

a gate electrode formed on said substrate between said source and drain regions; and an impurity region of a second conductivity type formed right underneath said drain region, said impurity region forming a parasitic bipolar transistor together with said source region and said substrate, wherein electric discharge of said drain region is enabled.

Another object of the present invention is to provide a semiconductor device, comprising:

a substrate;

a gate electrode formed on said substrate;

a first diffusion region of a first conductivity type formed in said substrate at a first side of said gate electrode;

a second diffusion region of said first conductivity type formed in said substrate at a second side of said gate electrode; and a third diffusion region of a second conductivity type formed in said substrate underneath said second diffusion region in contact with said second diffusion region, said third diffusion region containing an impurity element of said second conductivity type with a concentration level larger than a concentration level of an impurity element of said second conductivity type contained in a region right underneath said gate electrode when comparison is made at the same depth in said substrate.

In a preferred embodiment, the impurity element of the second conductivity type has a concentration level in the third diffusion region such that the concentration level is larger than the concentration level of the impurity element of the second conductivity type in the region right underneath the gate electrode by a factor of five or more, more preferably eight or more when comparison is made at the same depth in said substrate.

In a preferred embodiment, a silicide layer is formed on the surface of the second diffusion region with a separation from a sidewall insulation film provided on a sidewall of said gate electrode at said second side. Further, it is preferable that an insulation film is provided on the substrate in continuation from the sidewall insulation film up to the region where the silicide layer is formed. Further, it is preferable that a drain region of the first conductivity type is formed in the substrate in correspondence to the part on which the silicide layer is formed.

Another object of the present invention is to provide a semiconductor device, comprising:

a substrate;

a first gate electrode formed on said substrate;

a first diffusion region of a first conductivity type formed in said substrate at a first side of said gate electrode;

a second diffusion region of said first conductivity type formed in said substrate at a second side of said first gate electrode;

a third diffusion region of a second conductivity type formed in said substrate underneath said second diffusion region in contact with said second diffusion region;

a second gate electrode formed on said substrate at said first side of said gate electrode across said first diffusion region; and a fourth diffusion region of said first conductivity type formed in said substrate at said first side of said second gate electrode, said third diffusion region containing an impurity element of said second conductivity type with a concentration larger than a concentration of an impurity element of said second conductivity type in a region right underneath said gate electrode when comparison is made at the same depth in said substrate.

It is preferable that an insulation film extends over a surface of the substrate at the second side of the first gate electrode in continuation from a sidewall insulation film covering a sidewall surface of the first gate electrode at the second side. Further, it is preferable that a drain region of the first conductivity type is formed in the substrate in correspondence to the tip end of the insulation film and that a silicide layer is formed on the substrate surface in correspondence to the drain region.

Another object of the present invention is to provide a fabrication process of a semiconductor device, comprising the steps of:

forming first and second diffusion regions of a first conductivity type by introducing a first impurity element of said first conductivity type into a substrate by an ion implantation process while using a gate electrode pattern as a mask, such that said first and second diffusion regions are formed respectively at a first side and a second side of said gate electrode;

forming third and fourth diffusion regions of said first conductivity type by introducing a second impurity element of said first conductivity type and a third impurity element of a second conductivity type into said substrate by an ion implantation process while using said gate electrode pattern and sidewall insulation films formed at both lateral sidewall surfaces of said gate electrode as a mask, such that third and fourth diffusion regions said second conductivity type are formed respectively underneath said first and second diffusion regions;

forming an insulation film pattern on said substrate at said second side of said gate electrode such that said insulation film pattern extends along a surface of said substrate in the direction of said second side; and forming a silicide layer on said surface of said substrate at a tip end part of said insulation film pattern while using said insulation film pattern as a mask.

Further, the present invention provides an ESD-protection device that uses such a semiconductor device.

According to the present invention, a sharp p-n junction is formed over a wide area right underneath the drain region by forming a diffusion region of opposite conductivity type right underneath the drain region or drain extension region to which a voltage surge comes in. Thereby, there is caused easy avalanche breakdown at the p-n junction upon incoming of the surge voltage. Further, there is caused easy and efficient conduction of the parasitic lateral bipolar transistor at low voltage. Because the foregoing p-n junction is formed with a separation from the junction that provides the current path for the lateral parasitic bipolar transistor, the problem of concentration of heating is relieved, and an ESD-protection device having a capability of handing large electric discharge current is obtained. The semiconductor device of the present invention can be formed simultaneously with other low-voltage MOS transistors constituting the semiconductor integrated circuit.

Other objects and further features of the present invention will become apparent from the following detailed description when read in conjunction with the attached drawings.

BRIEF DESCRIPTION OF THE DRAWINGS

FIGS. 14A–14D are diagrams showing the fabrication process of the semiconductor device constituting an ESD-protection circuit according to a fourth embodiment of the present invention;

FIGS. 16A–16K are diagrams showing the process of forming the ESD-protection circuit of the fifth embodiment of the present invention together with the process of forming other semiconductor devices that form an integrated circuit;

FIGS. 18A–18D are diagrams showing various examples of silicide block patterns in an ESD-protection circuit having a cascade construction according to a sixth embodiment of the present invention;

DETAILED DESCRIPTION OF THE INVENTION

[FIRST EMBODIMENT]

Figure 8:
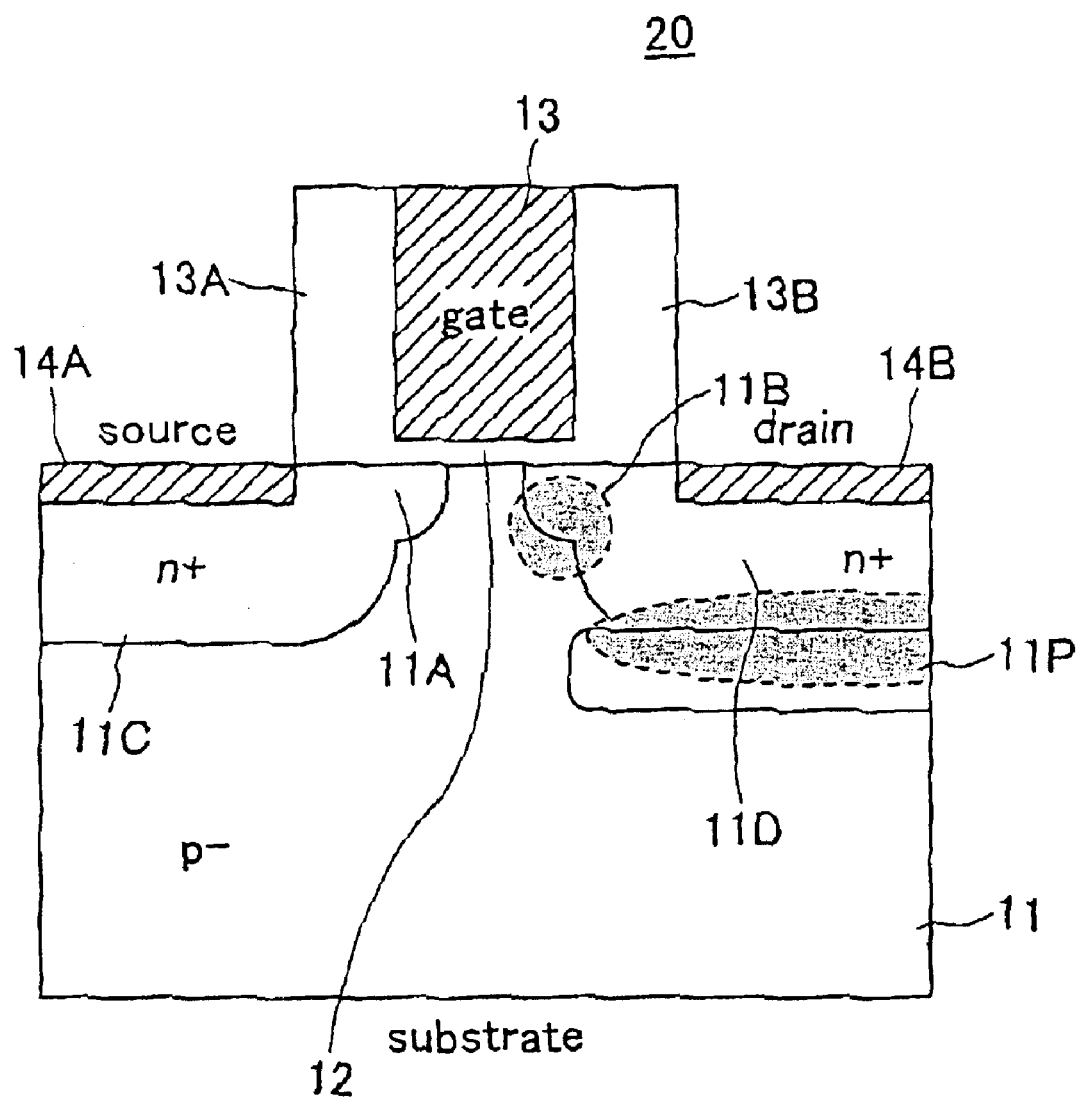
FIG. 8 is a diagram showing the construction of an ESD-protection circuit according to a first embodiment of the present invention.
Figure 9:
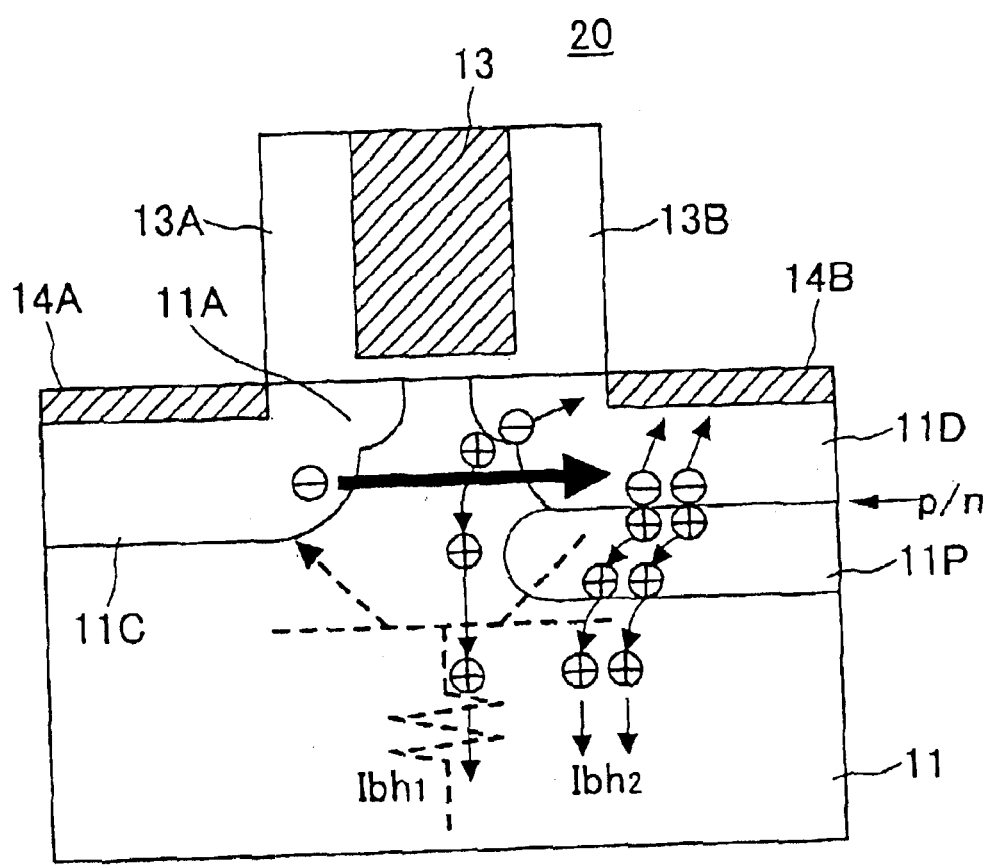
FIG. 9 is a diagram showing the operation of the ESD-protection circuit of FIG. 8.

FIGS. 8 and 9 show the construction of an ESD-protection circuit 20 according to a first embodiment of the present invention, wherein those parts corresponding to the parts explained previously are designated by the same reference numerals and the description thereof will be omitted.

Referring to FIG. 8, the ESD-protection circuit 20 of the present invention forms a part of an integrated circuit and includes a p-type diffusion region 11P formed in the silicon substrate 11 right underneath the n+-type diffusion region 11D so that the diffusion region 11P partially overlaps with the diffusion region 11D. As a result, there is formed a p-n junction interface p/n between the diffusion region 11D and the diffusion region 11P at the depth shallower than the bottom edge of the diffusion region 11D for the case in which the formation of the diffusion region 11P is not made. Because there is caused no substantial change in the n-type dopant concentration in the diffusion region 11D as a result of the formation of the diffusion region 11P, the formation of the p-n junction interface p/n in such a shallow level causes a steep change of carrier density at the p-n junction interface, resulting in formation of a steep or sharp carrier distribution profile. Associated with this, a depletion region of reduced thickness is formed at the p-n junction interface p/n.

Figure 1:
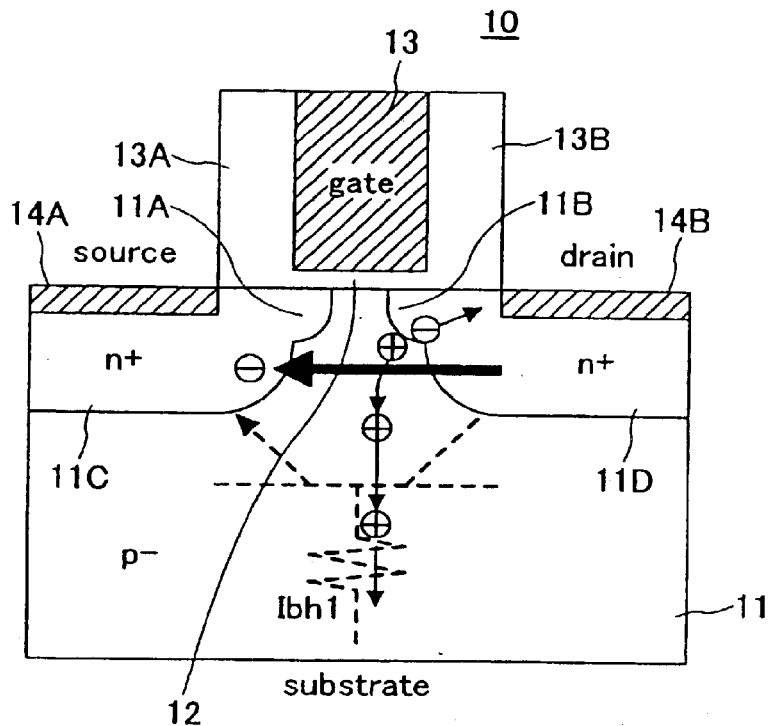
FIG. 1 is a diagram showing the construction of a semiconductor device constituting a conventional ESD-protection circuit.

Thus, when a surge voltage comes in to the diffusion region 11D, there is caused an avalanche breakdown at the foregoing p-n junction interface, in addition to the operation of the parasitic bipolar transistor explained with reference to FIG. 1, and there is formed a hole current Ibh2 flowing to the substrate 11.

Because the p-n junction interface p/n extends over a wide area along the interface between the diffusion region 11D and the diffusion region 11P, it becomes possible to induce such a hole current with lower voltage. Further, because of the fact that the p-n junction is offset from the junction in which a large current is caused to flow upon conduction of the parasitic bipolar transistor, the problem of destruction of the device 20 as a result of localized heating is effectively suppressed.

Figure 10:
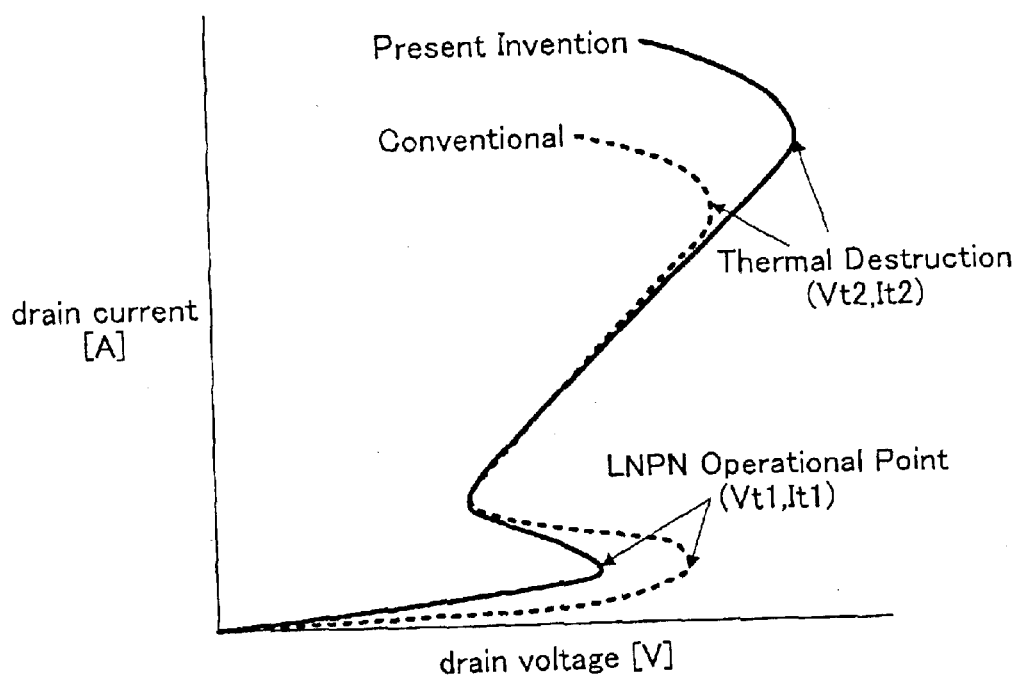
FIG. 10 is a diagram showing the discharge characteristics of the ESD-protection circuit of FIGS. 8 and 9 in comparison with a conventional ESD-protection circuit.

FIG. 10 shows the drain current-drain voltage characteristics of the device 20 of FIGS. 8 and 9.

Referring to FIG. 10, it can be seen that an LNPN point representing the operational point in which the conduction of the lateral bipolar transistor takes place in the semiconductor device 20, is shifted in the low-voltage side. Further, it can be seen that the value of the current and the voltage corresponding to the thermal destruction of the semiconductor device 20 is increased as compared with the case of the conventional structure of FIG. 1.

Figure 3:
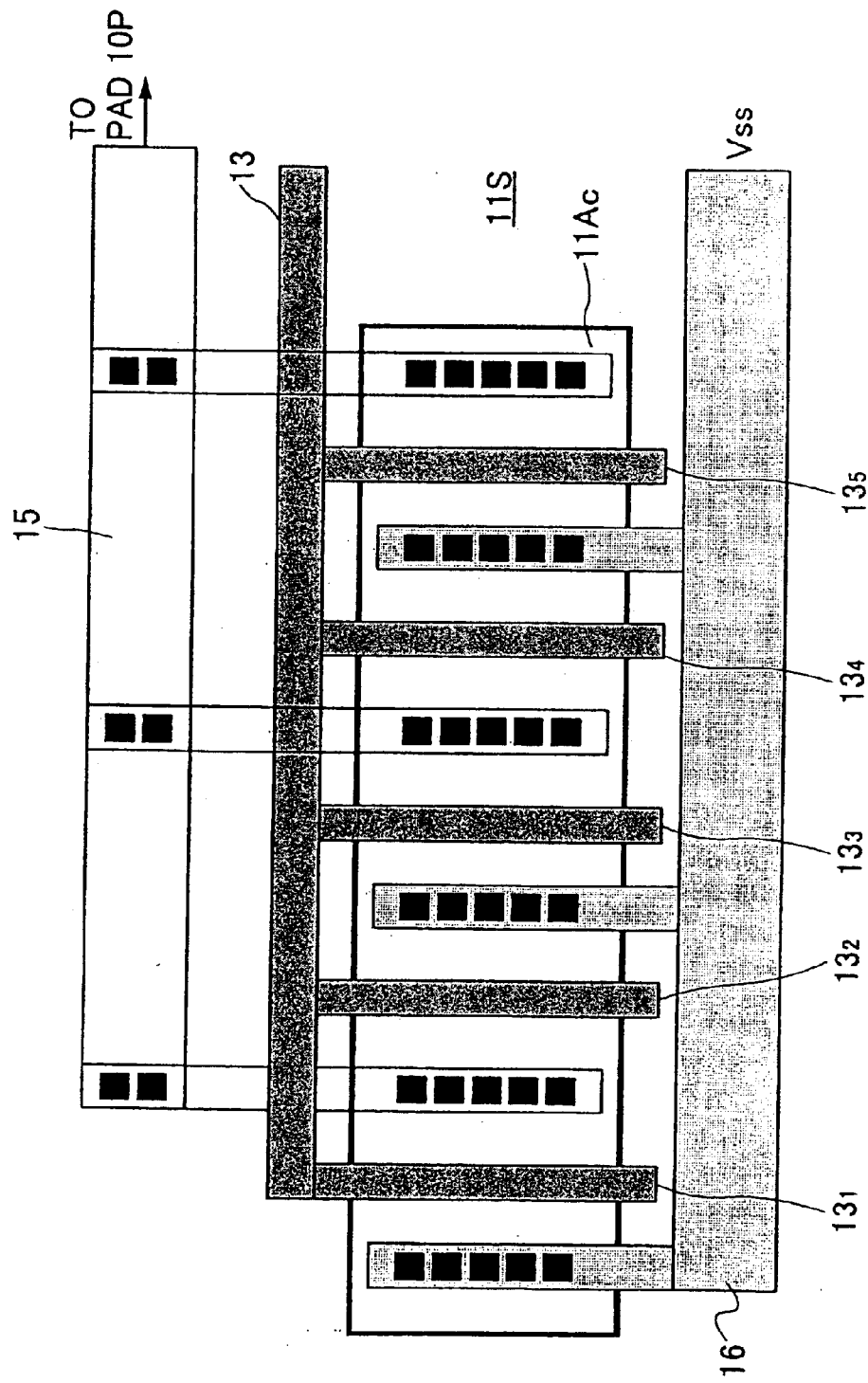
FIG. 3 is a diagram showing the construction of a conventional ESD-protection circuit formed to have a multiple finger construction by using the semiconductor device of FIG. 1 in a plan view.

Thus, the semiconductor device 20 becomes less vulnerable against ESD. Further, the activation of the ESD-protection operation is caused at a lower surge voltage, and the problem of the discharge current concentrating to a specific finger or branch is reduced in the case the semiconductor device 20 is configured into the multiple-finger arrangement such as the one shown in FIG. 3. By combining the ballast resistors in such a construction, it becomes possible to realize an extremely uniform discharge operation for all of the fingers.

Figure 11A:
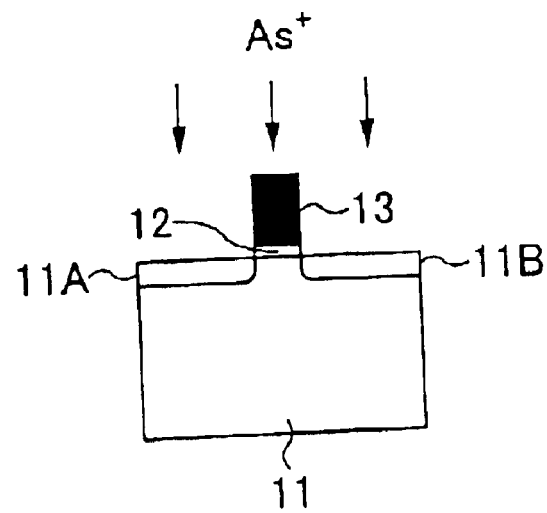
FIGS. 11A–11C are diagrams showing the fabrication process of a semiconductor device constituting the ESD-protection circuit of FIGS. 8 and 9.
Figure 11B:
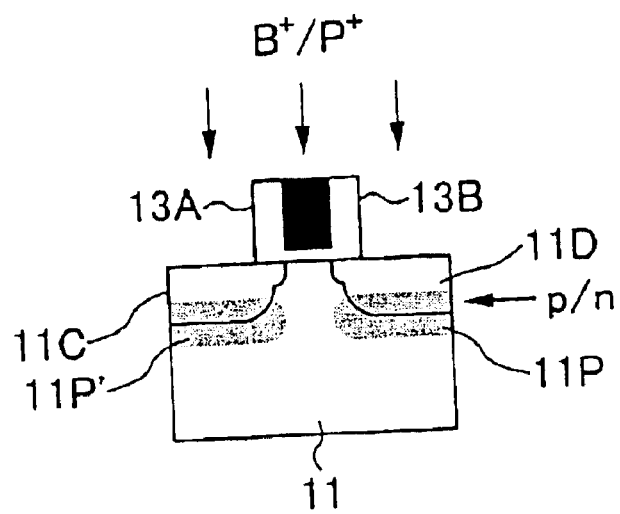
Figure 11C:
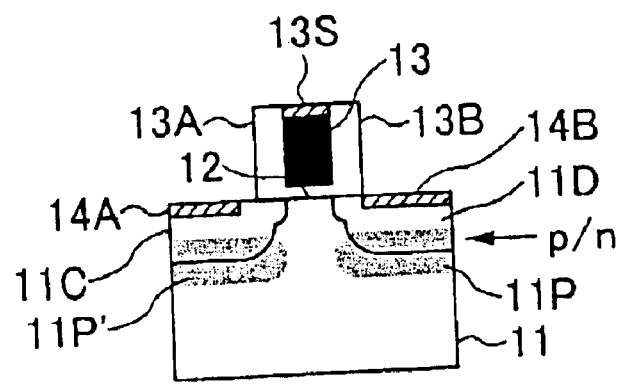

FIGS. 11A–11C show the fabrication process of the semiconductor device 20 of FIGS. 8 and 9.

Referring to FIG. 11A, the p-type substrate 11 is defined with an active region by an STI structure (not shown) having a depth of 0.4 $\mu$m, and the gate electrode pattern 13 is formed on the active region via the gate insulation film 12. Further, ion implantation of As (arsenic) is conducted into the active region with a dose of $1 \times 10^{15}$ cm$^{-2}$ under the acceleration voltage of 10 keV while using the gate electrode pattern 13 as a mask, and the diffusion regions 11A and 11B of n--type are formed at both lateral sides of the gate electrode pattern 13 respectively as the source or drain extension regions.

Next, the sidewall insulation films 13A and 13B are formed on the sidewall surfaces of the gate electrode 13 by deposition of an insulation film followed by an anisotropic etch-back process, and ion implantation of P (phosphorous) is conducted by an ion implantation process with a dose of $2 \times 10^{15}$ cm$^{-2}$ under an acceleration voltage of 15 keV, and the diffusion regions 11C and 11D of n+-type are formed in the Si substrate 11 at both lateral sides of the gate electrode pattern 13. Further, an ion implantation process of B (boron) is conducted in which the ion implantation of B is conducted with a dose of $1 \times 10^{14}$ cm$^{-2}$ under an acceleration voltage of 40 keV. Thereby, the diffusion region 11P' is formed right underneath the diffusion region 11C of n+-type and the diffusion region 11P of p-type is formed right underneath the diffusion region 11D of n+-type. The diffusion regions 11P and 11P' of p-type are formed so as to overlap partially with the overlying diffusion regions 11D and 11C of n-type.

In the step of FIG. 11B, it should be noted that the ion implantation process of B is preferably conducted in the state that a resist pattern (not shown) is formed so as to cover the interior or main part of the integrated circuit for avoiding the increase of junction capacitance in the transistors formed inside the semiconductor integrated circuit. Further, it is also possible to provide a resist pattern suppressing the formation of the diffusion region 11P' at the time of the ion implantation process of B. The impurity elements thus introduced are activated by conducting a thermal annealing process at 1000° C. for about 10 seconds.

In the step of FIG. 11B, it should be noted that the formation of the p-type diffusion region 11P or 11P' can be conducted before the formation of the sidewall insulation films 13A and 13B, or alternatively after the formation of the sidewall insulation films 13A and 13B but before the formation of the diffusion regions 11C or 11D.

Further, in the step of FIG. 11C, the silicide layers 14A and 14B are formed on the respective surfaces of the diffusion regions 11C and 11C. Further, the silicide region 13S is formed on the surface of the gate electrode 13. While not illustrated, the silicide layer 14B is connected to the pad electrode 10P of FIG. 2 via an interconnection pattern.

Figure 4:
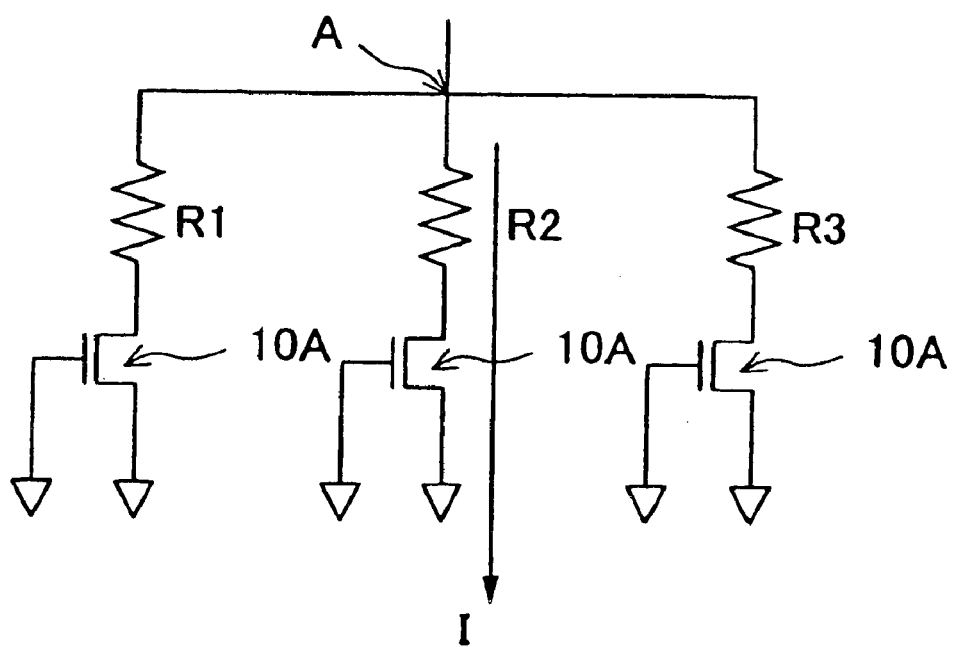
FIG. 4 is a diagram explaining the operation of the EDS-protection circuit of FIG. 3.

While FIG. 11C does not show the ballast resistors R1–R3 explained with reference to FIG. 4, such a ballast resistor can be formed by forming a polysilicon pattern or by forming an n-type well inside the Si substrate 11. Alternatively, the ballast resistor may be formed by forming a via contact. With regard to the formation of ballast resistor by way of formation of an n-type well, reference should be made to Sanjay Dabral, et al., Basic ESD and I/O Design, pp. 189, John Wiley and Sons, 1998.

[SECOND EMBODIMENT]

FIGS. 12A–12D show the fabrication process of an ESD-protection input/output circuit 30 according to a second embodiment of the present invention.

Figure 12A:
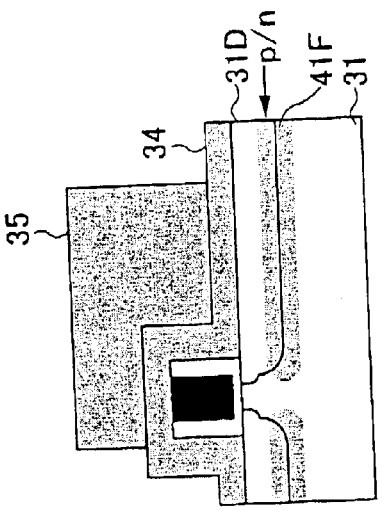
FIGS. 12A–12D are diagrams showing the fabrication process of the semiconductor device constituting an ESD-protection circuit according to a second embodiment of the present invention.

Referring to FIG. 12A, a gate insulation film 32 is formed on a p-type Si substrate 31 formed with an STI device isolation structure (not shown) with a depth of about 0.4 μm such that the gate insulation film 32 covers a device region defined by the device isolation structure. Further, a gate electrode pattern 33 of polysilicon is formed on the gate insulation film 32.

Further, ion implantation process of As is conducted in the step of FIG. 12A while using the gate electrode pattern 33 as a mask, and a source region 31A of n-type is formed at a first side of the gate electrode pattern 33, while a drain region 31B of n-type is formed at a second side of the gate electrode pattern 33 in correspondence to a drain extension region Dex. The ion implantation process may be conducted under the acceleration voltage of 10 keV with a dose of $1 \times 10^{15}$ cm$^{-2}$.

Figure 12B:
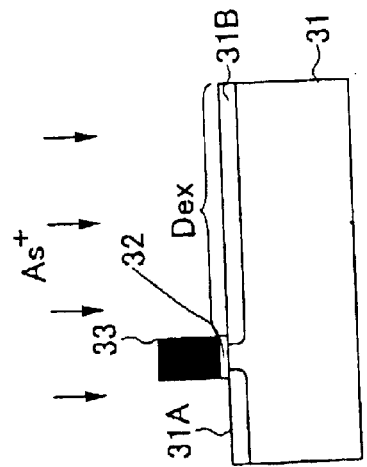

Next, in the step of FIG. 12B, sidewall insulation films 33A and 33B are formed on the sidewall surfaces of the gate electrode pattern 33, followed by an ion implantation process of P under the acceleration voltage of 15 keV with a dose of $2 \times 10^{15}$ cm$^{-2}$ while using the gate electrode pattern 33 and the sidewall insulation films 33A and 33B as a mask. Further, ion implantation of B is conducted subsequently under the acceleration voltage of 40 keV with a dose of $1 \times 10^{14}$ cm$^{-2}$ while using the gate electrode pattern 33 and the sidewall insulation films 33A and 33B as a mask. Further, a thermal annealing process is conducted at 1000° C. for ten seconds, and there are formed diffusion regions 31C and 31D of n+-type such that the diffusion region 31C is located at the first side of the sidewall insulation film 33A and such that the diffusion region 31D is located at the second side of the sidewall insulation film 33B. Further, it should be noted that there is formed a p-type diffusion region 31E is formed underneath the n+-type diffusion region 31C and a p-type diffusion region 31F is formed underneath the n+-type diffusion region 31D. While the formation of the p-type diffusion region 31E is not mandatory, the diffusion region 31E is formed simultaneously with the p-type diffusion region 31D in view of reducing the number of fabrication steps.

As a result of formation of the p-type diffusion region 31F, there is formed a p-n junction p/n at a location slightly above the bottom edge of the n+-type diffusion region 31D of the state of FIG. 12A, while existence of the p/n junction at such a location induces formation of a narrow depletion region characterized by a steep carrier distribution profile.

Figure 12C:
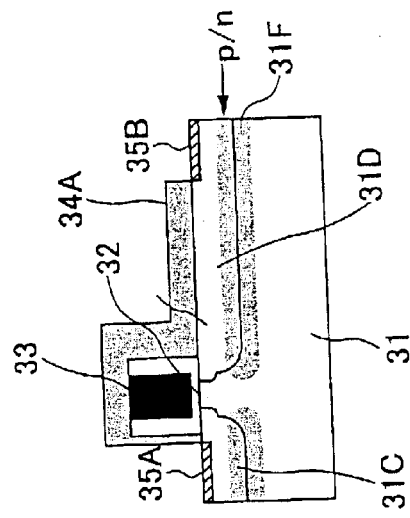

Next, in the step of FIG. 12C, an insulation film 34 such as a silicon oxide film is formed on the structure of FIG. 12B uniformly by a CVD process, and an insulation pattern 34A is formed by patterning the insulation film 34 thus formed by using a resist pattern 35. As a result, the n+-type diffusion region 31C constituting the source region is exposed at the first side of the gate electrode. Further, the n+-type diffusion region 31D forming the drain region is exposed at the second side of the gate electrode 33 with a separation from the gate electrode 33.

Figure 12D:
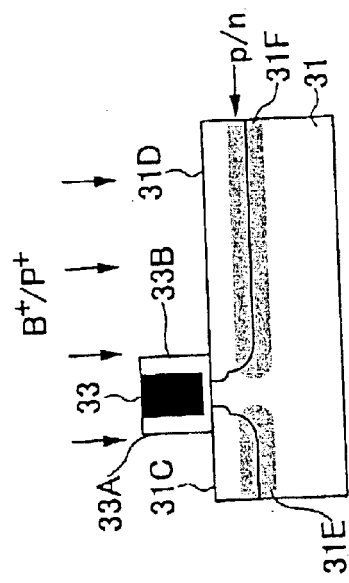

Further, in the step of FIG. 12D, formation of the silicide layers 35A and 35B is conducted respectively on the source region and the drain region while using the insulation pattern 34A as a silicide block pattern suppressing the silicide formation.

Figure 5:
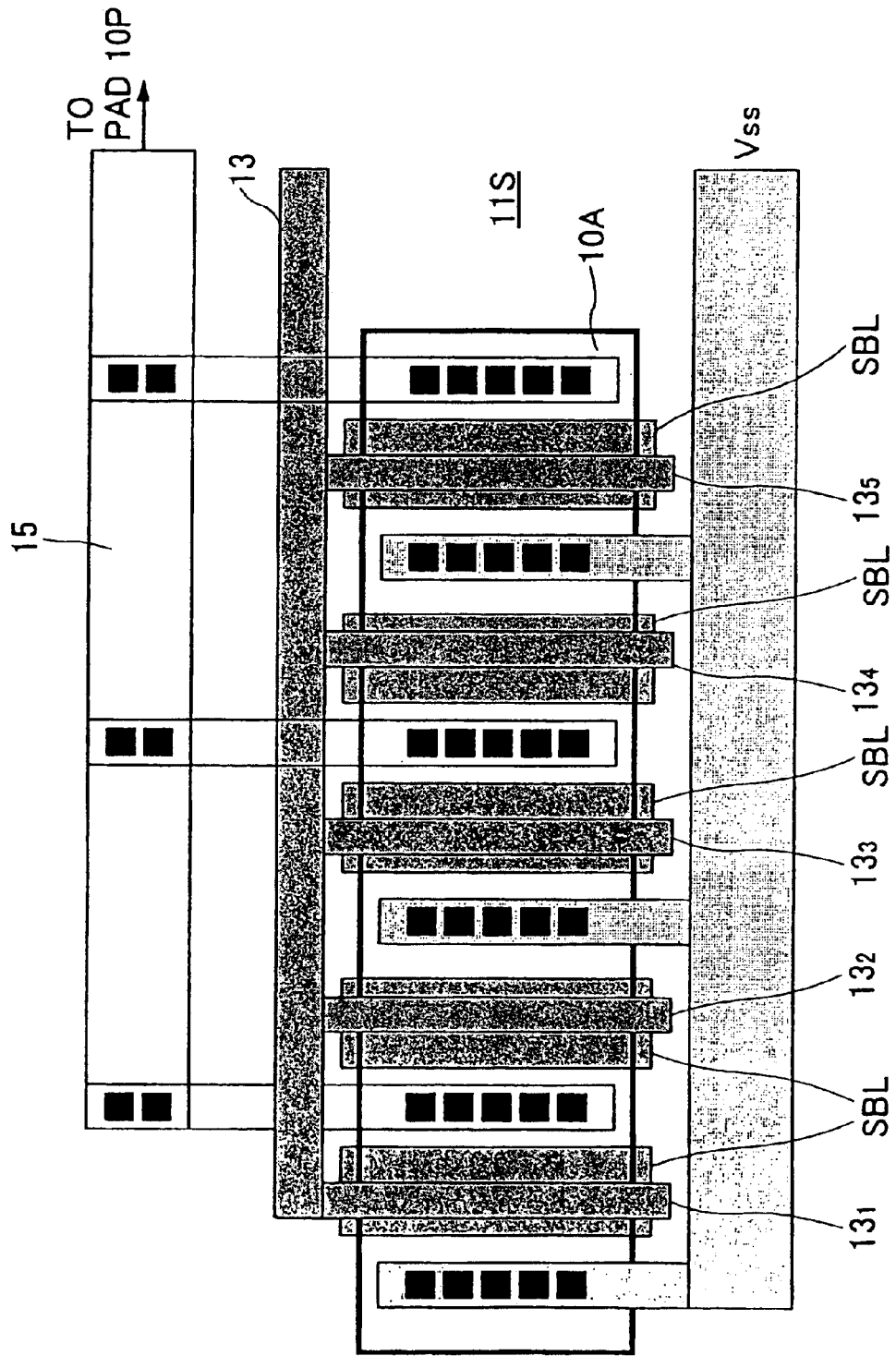
FIG. 5 is a diagram showing an example of the conventional ESD-protection circuit having multiple fingers wherein silicide block regions are provided.
Figure 6:
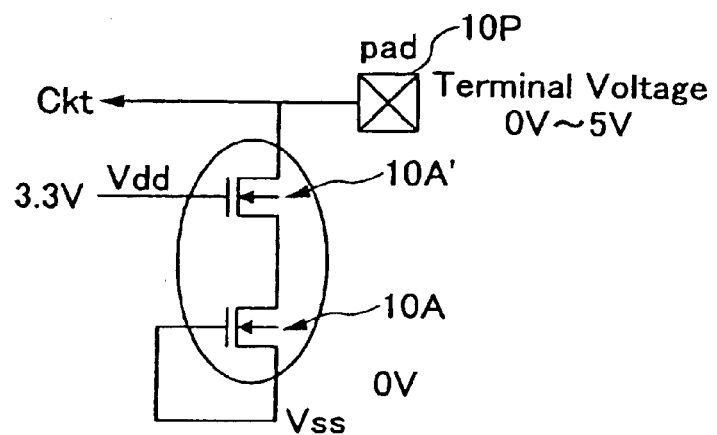
FIG. 6 is a circuit diagram showing the construction of a conventional ESD-protection circuit having a cascade construction.

In the present embodiment, it should be noted that there is formed an avalanche breakdown at the region right underneath the n+-type diffusion region 31D easily, and the problem of destruction caused in the semiconductor device by localized heating is effectively suppressed. It should be noted that the drain contact region having the silicide layer 35B thus formed is located with substantial separation from the gate electrode 33. Thus, it is possible to use the n-type diffusion region 31D located between the gate electrode and the drain contact region as a ballast resistance, and the ESD-protection input/output circuit having the finger-shaped layout of FIGS. 4 and 5 is formed easily.

Figure 2:
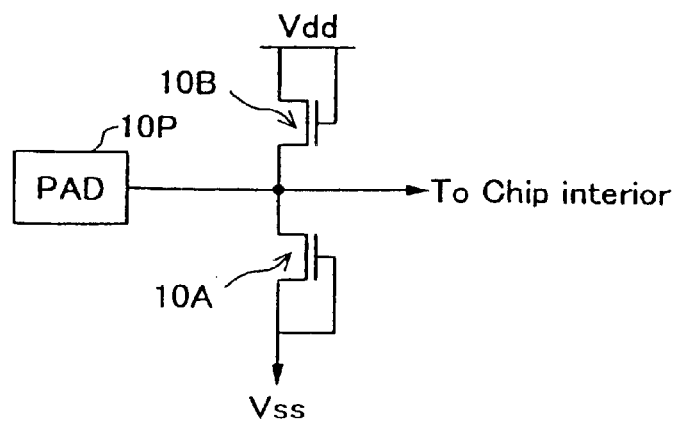
FIG. 2 is a diagram showing the equivalent circuit diagram of the ESD-protection circuit of FIG. 1.

Thus, while not illustrated, it should be noted that the silicide layer 35A, the polysilicon gate electrode 33 and the Si substrate 31 are connected to the power supply line at the Vss level via respective interconnection layers, while the silicide layer 35B is connected to the pad electrode 10P shown in FIG. 2.

As explained previously, the present embodiment easily causes avalanche breakdown in the region right underneath the drain extension region formed of the n+-type diffusion region 31D, and as a result, the problem of localized heating inside the device is relieved and the ESD-protection input/output circuit remains intact even in the case a large surge voltage comes in. Further, because of the fact that the drain region having the silicide layer 35B is formed with a large separation from the gate electrode 33, it n-type diffusion region 31D constituting the drain extension region between the gate electrode and the drain region can be used for the ballast resistor, and it becomes possible to construct the ESD-protection input/output circuit having the finger-shaped layout shown in FIGS. 4 and 5 can be constructed easily.

[THIRD EMBODIMENT]

FIGS. 13A—13D show the fabrication process of a semiconductor device 40 having an ESD-protection input/output circuit according to a third embodiment of the present invention.

Figure 13A:
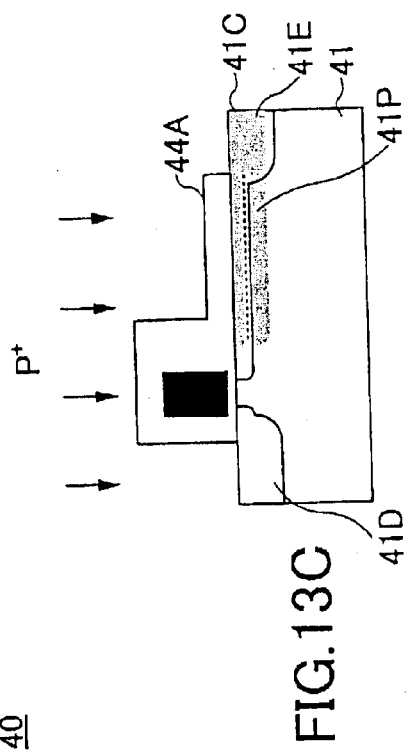
FIGS. 13A–13D are diagrams showing the fabrication process of the semiconductor device constituting an ESD-protection circuit according to a third embodiment of the present invention.

Referring to FIG. 13A, there is formed a polysilicon gate electrode pattern 43' on a Si substrate 41 of p-type via a gate insulation film 42, and there are formed n-type diffusion regions 41A and 41B in the Si substrate 41 respectively at a source side and a drain side of the gate electrode pattern 43 by conducting an ion implantation process of P with a dose of $3\times10^{13}$ cm$^{-2}$ under an acceleration voltage of 30 keV while using the polysilicon gate electrode pattern 43 as a mask.

In the step of FIG. 13A, it should further be noted that there is formed a resist pattern 43R on the Si substrate 41 so as to cover the gate electrode pattern 43 while exposing a part of the Si substrate 41 corresponding to the drain extension region 41Dex to be formed, and ion implantation of B is conducted under the acceleration voltage of 10 keV with a dose of $1\times10^{13}$ cm$^{-2}$. Further, ion implantation of As is conducted while using the same resist pattern 43R as a mask under the acceleration voltage of 5 keV with a dose of $2\times10^{14}$ cm$^{-2}$. By activating B and As thus introduced by conducting an RTP processing, there is formed an extremely shallow n+-type diffusion region 41C on the surface of the Si substrate 41 accompanied with a p-type diffusion region 41P located right underneath the diffusion region 41C. The diffusion regions 41C and 41P thereby form together a p-n junction characterized by a sharp change of carrier concentration generally in the diffusion region 41B in correspondence to the part represented in FIG. 13A by a dotted line.

In the step of FIG. 13A, it should be noted that the resist pattern 43R is formed so as to cover the part extending from the gate electrode 43 up to the distance of 0.2 µm such that formation of the diffusion regions 41C and 41P do not affect the transistor operation. Further, it should be noted that formation of the resist pattern 43R may be restricted to the region in the vicinity of the gate electrode 43, such that the ion implantation of As occurs with overlapping with the diffusion region 41A. In this case, however, it should be noted that there is caused slight increase of source resistance because of the formation of the p-type diffusion region right underneath the diffusion region 41A. In the event the ESD-protection device has sufficient capability of electric discharge, the n-type diffusion region 41C may be omitted.

Figure 13B:
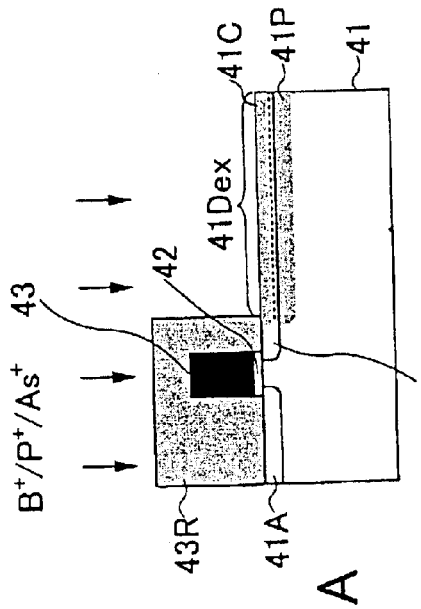

Next, in the step of FIG. 13B, the resist pattern 43R is removed, and an insulation film 44 of SiO2 or the like is formed on the Si substrate 41 by a CVD process uniformly so as to cover the gate electrode pattern 43.

Figure 13C:
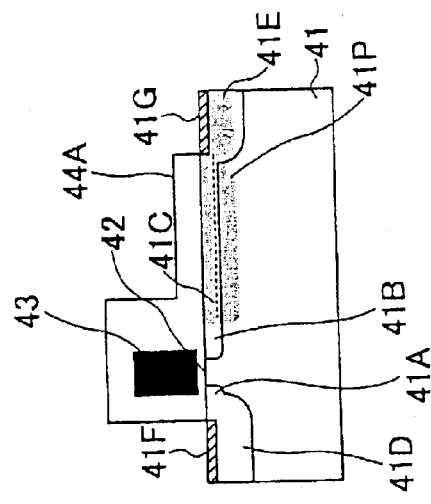

In the step of FIG. 13B, it should further be noted that there is formed a resist pattern 44R on the insulation film 44, and in the step of FIG. 13C, the insulation film 44 is patterned while using the resist pattern 44R as a mask. As a result, the source region is exposed at the source side of the gate electrode 43 with a separation corresponding to the extension of the sidewall insulation film. At the drain side of the gate electrode 43, the drain region is exposed with a separation corresponding to the drain extension region as measured from the gate electrode 43.

In the step of FIG. 13C, the source region and the drain region thus exposed are subjected to an ion implantation process of P under the acceleration voltage of 15 keV with a dose of $2\times10^{15}$ cm$^{-2}$. Further, by conducting a rapid thermal annealing process at 1000° C. for 10 seconds, there are formed diffusion regions 41D and 41E of n+-type.

Figure 13D:
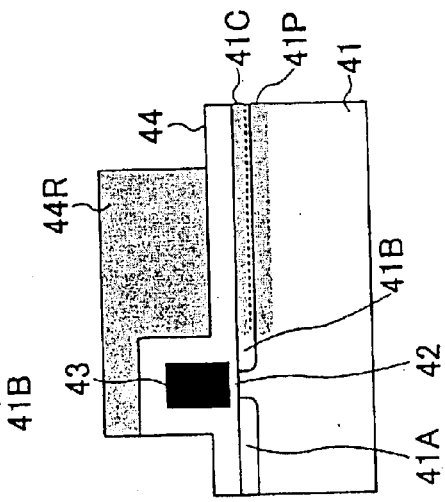

Further, in the step of FIG. 13D, silicide layers 41F and 41G are formed respectively on the surface of the source region and the surface of the drain region. Thereby, it should be noted that the insulation pattern 44A is used as a silicide block pattern in the step of FIG. 13D.

In the present embodiment, too, it should be noted that the n+-type diffusion region 41E is formed at the tip end part of the drain extension region formed of the diffusion regions 41B and 41C with a separation from the gate electrode 43. Thus, by connecting the silicide region 41G to the pad electrode 10P and the gate electrode 43 and the4 silicide region 41F to the power supply line Vss, it is possible to construct the ESD-protection circuit having the ballast resistors R$_1$–R$_3$ explained with reference to FIGS. 4 and 5.

In the ESD-protection input/output circuit 40 of the present embodiment, it should be noted that the silicide block pattern 44A constitutes also the gate sidewall insulation film, and thus, it is possible to eliminate the process of forming a sidewall insulation film on a gate electrode pattern. In the present embodiment, there is formed no diffusion region having a depth corresponding to the depth of the diffusion region on which formation of silicide layer is made. Even in such a case, it is possible to cause efficient avalanche breakdown at the junction interface of the diffusion region 41C and the underlying diffusion region 41P upon incoming of the surge voltage to the pad electrode 10P by forming the shallow n+-type diffusion region 41C at the surface part of the substrate 41 in the step of FIG. 13A.

[FOURTH EMBODIMENT]

FIGS. 14A–14D show the fabrication process of a semiconductor device 50 that constitutes an ESD-protection input/output circuit according to a fourth embodiment of the present invention.

Referring to FIG. 14A, a polysilicon gate electrode pattern 53 is formed on the p-type Si substrate 51 via an intervening gate insulation film 52, and n-type diffusion regions 51A and 51B are formed in the Si substrate 51 respectively at the source region and the drain region of the gate electrode pattern 53 by conducting ion implantation process of P under the acceleration voltage of 30 keV with a dose of $3\times10^{13}$ cm$^{-2}$ while using the polysilicon gate electrode pattern 53 as a mask.

In the step of FIG. 14A, a resist pattern 53R is provided further on the Si substrate 51 so as to cover the gate electrode 53 while exposing the part of the Si substrate 51 corresponding to the drain extension region 51Dex to be formed, and ion implantation of B is conducted under the acceleration voltage of 30 keV with a dose of $5\times10^{13}$ cm$^{-2}$ while using the resist pattern 53R as a mask. Further, ion implantation of As is conducted subsequently while using the same resist pattern 53R as a mask under the acceleration voltage of 5 keV with a dose of $1\times10^{15}$ cm$^{-2}$. By activating B and As thus introduced by RTP processing, there is formed an extremely shallow n+-type diffusion region 51C on the surface of the Si substrate 51 accompanied with a p-type diffusion region 51P formed right underneath the diffusion region 51C. Thereby, the diffusion regions 51C and 51P form together a p-n junction characterized by a sharp change of carrier concentration generally in correspondence to the part represented in the diffusion region 51C of FIG. 14A by a dotted line.

In the step of FIG. 14A, it should be noted that the resist pattern 53R is formed so as to cover the gate electrode 53 and further a part of the substrate 51 extending over a distance of 0.2 µm in the direction of the drain region as measured from the gate electrode 53. Thereby, it should be noted that formation of the resist pattern 53R may be limited to the part in the vicinity of the gate electrode 53 such that ion implantation of B and As takes place in superposition with the diffusion region 51A. In this case, however, it should be noted that there may be caused slight increase of the source resistance because of the formation of the p-type diffusion region right underneath the diffusion region 51A. Further, the n-type diffusion region 51C may be omitted in the event the ESD-protection circuit has a sufficient capability of electric discharge.

Next, in the step of FIG. 14B, the resist pattern 53R is removed and an insulation film 54 of an SiO$_2$ film or the like is formed on the Si substrate 51 so as to cover the gate electrode pattern 53 uniformly.

Next, in the step of FIG. 14B, there is formed a resist pattern 54R on the insulation film 54 so as to cover a part of the insulation film that extends in the drain direction along the Si substrate 51, and a source region is exposed in the step of FIG. 14C at the source side of the gate electrode 53 with a separation corresponding to the thickness of the sidewall insulation film, by patterning the insulation film 54 while using the resist pattern 54R as a mask. Further, a drain region is exposed at the drain side of the gate electrode 53 with a separation corresponding to the length of the drain extension region as measured from the gate electrode 53.

In the patterning step of FIG. 14C, the insulation film 54 is removed also from the gate electrode 53 and the surface of the gate electrode 53 is exposed.

Further, in the step of FIG. 14C, the source region and the drain region thus exposed are subjected to an ion implantation process of P conducted under an acceleration voltage of 20 keV with a dose of $5 \times 10^{15}$ cm$^{-2}$ while using the insulation pattern 54A patterned in the step of FIG. 14C as a mask. By conducting a rapid thermal annealing process at 1000° C. for 10 seconds thereafter, there are formed n+-type diffusion regions 51D and 51E.

Further, in the step of FIG. 14D, silicide layers 51F and 51G are formed on the source region and the drain region, respectively. Thus, in the step of FIG. 14D, the insulation pattern 44A is uses as a silicide block pattern.

In the step of FIG. 14D, it should be noted that there is formed a silicide layer 51H also on the gate electrode 53 at the same time.

According to the present invention, the gate resistance is reduced significantly as a result of formation of the silicide layer 51H on the gate electrode 53.

In the present embodiment, too, it should be noted that the diffusion region 51E of n+-type is formed at the tip end part of the drain extension region formed of the diffusion regions 51B and 51C with a separation from the gate electrode 53, and because of this, it becomes possible to construct an ESD-protection circuit having the ballast resistors R1–R3 explained with reference to FIGS. 4 and 5 by connecting the silicide region 51G to the pad electrode 10P and by connecting the silicide layer 51H and the silicide region 51F to the power supply line Vss.

In the ESD-protection input/output circuit of the present embodiment, it should be noted that the silicide block pattern 54A functions as the gate sidewall insulation films, and thus, there is no need of the step of forming the sidewall insulation films on the gate electrode pattern 53. In the present embodiment, no diffusion region is formed underneath the silicide block pattern 54A with the depth identical with the depth of the diffusion region on which the silicide is formed. Even in such a case, it is possible to induce efficient avalanche breakdown at the junction interface between the diffusion region 51C and the underlying p-type diffusion region 51P upon incoming of the surge voltage to the pad electrode 10P, by forming the extremely shallow n+-type diffusion region 51C on the surface of the Si substrate 51 in the step of FIG. 14A.

Figure 15A:
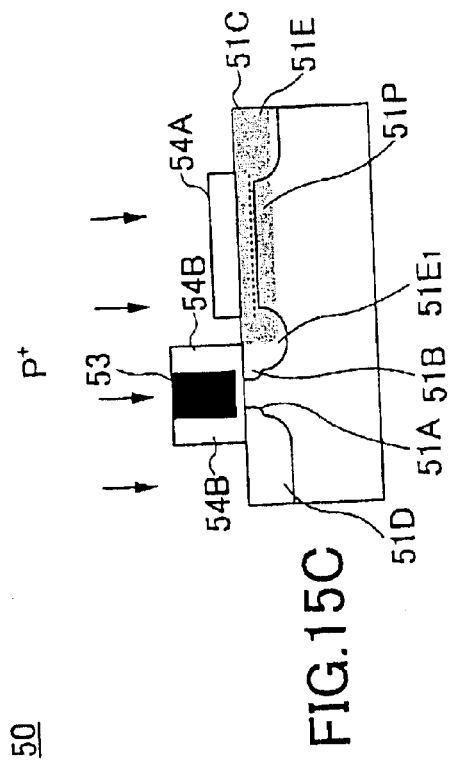
FIGS. 15A–15D are diagrams showing the fabrication process of the semiconductor device constituting an ESD-protection circuit according to a fifth embodiment of the present invention.
Figure 15B:
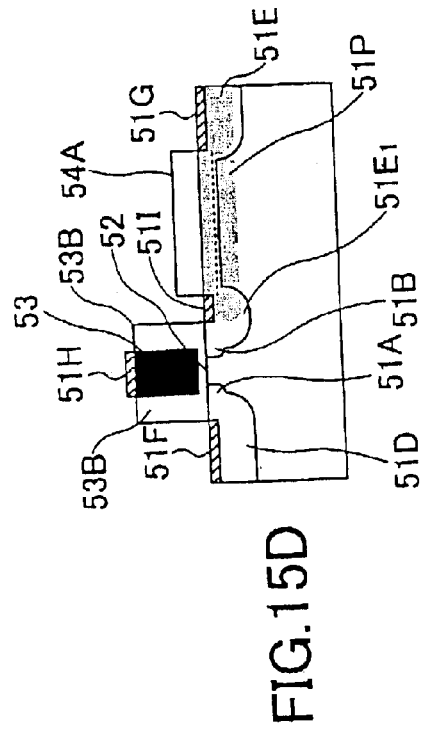

It should be noted that the example of FIGS. 14A–14D represents an ideal case of forming the resist pattern 54R in the step of FIG. 14B such that the resist pattern 54R is formed in intimate contact with the part of the insulation film 54 covering the sidewall surface of the gate electrode pattern 53 and such that the part of the insulation film 54 covering the top surface of the gate electrode pattern 53 is not covered. In practice, however, there can be a case in which the resist pattern 54R is formed with offset from the state of FIG. 14B in the side of the drain as represented in FIG. 15B in the process of FIGS. 15A–15D.

Figure 15C:
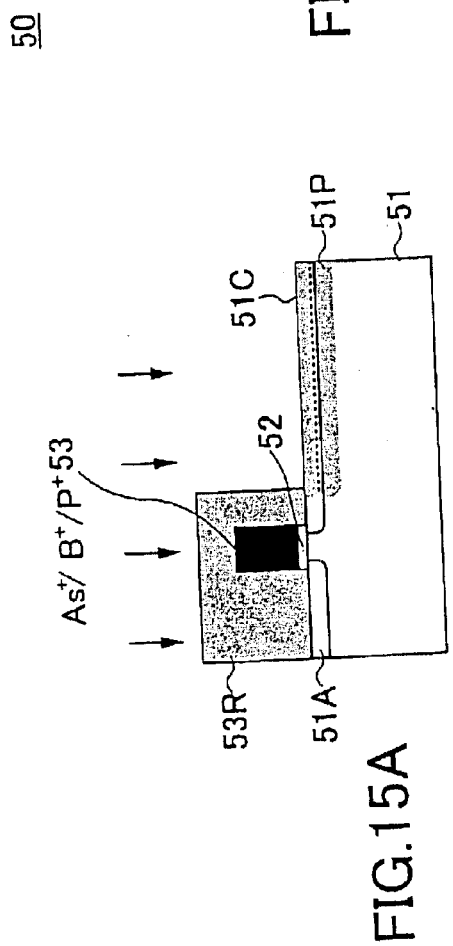

In such a case, it should be noted that the silicide block pattern 54A, formed in the step of FIG. 15C corresponding to the step of FIG. 14C by patterning the insulation film 54 while using the resist pattern 54R as a mask, forms an isolated pattern, and there is formed a sidewall insulation film 54B on the sidewall surface of the gate electrode pattern 53 with separation from the silicide block pattern 54A. Further, there is formed a gap between the sidewall insulation film 54B at the drain side and the silicide block pattern 54A. Thus, there is formed a diffusion region 51E$_1$ of n+-type in correspondence to the foregoing gap when ion implantation of P is conducted in the step of FIG. 15C for forming the n+-type diffusion region 51E.

Figure 15D:
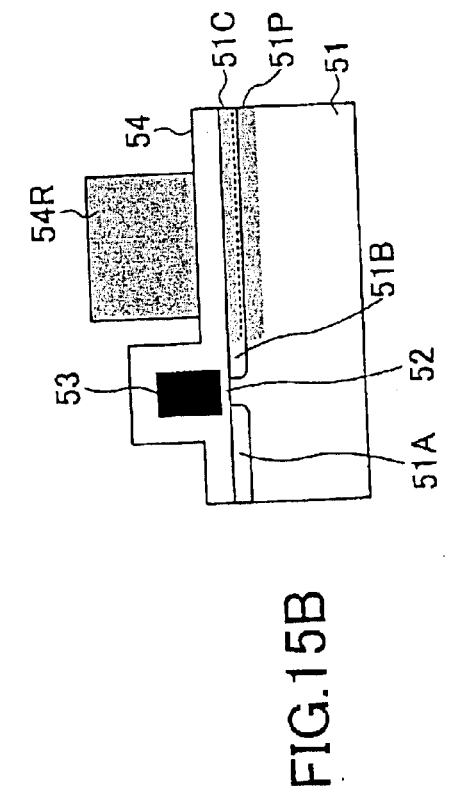

Thus, in the step of FIG. 15D, there is formed a silicide layer 51I in correspondence to the diffusion region 51E$_1$ at the time of silicide formation in the step of FIG. 15D, in addition to the silicide layers 51F, 51G and 51H.

In the ESD-protection input/output circuit of such a construction too, the advantageous features of the present embodiment explained before are obtained.

[FIFTH EMBODIMENT]

In the embodiments described heretofore, only the process of forming the ESD-protection input/output circuit has been explained. On the other hand, it should be noted that the ESD-protection input/output circuit of the present invention is formed as a part of a semiconductor integrated circuit device together with other semiconductor elements of the semiconductor integrated circuit.

In the present embodiment, the fabrication process of an ESD-protection input/output circuit will be explained with regard to example of the ESD-protection input/output circuit 50 having the structure of FIG. 15D with reference to FIGS. 16A–16K.

In the illustrated example, the semiconductor integrated circuit device includes an n-channel MOS transistor and a p-channel MOS transistor operating at the supply voltage of 1.2V (referred to hereinafter as 1.2V MOS transistors), an n-channel MOS transistor operating at the supply voltage of 3.3V (referred to hereinafter as 3.3V MOS transistor), and an ESD-protection input/output circuit operating at the supply voltage of 3.3V, wherein it should be noted that the 1.2V n-channel MOS transistor and the 1.2V p-channel MOS transistor have a gate length of 0.11 μm and a gate insulation film of 1.8 nm thickness. Further, the 3.3V n-channel MOS transistor and the n-channel MOS transistor constitution the ESD-protection input/output circuit have a gate length of 0.34 μm and a gate insulation film of the 7.5 nm thickness. In the drawings, those parts corresponding to the parts explained previously are designated by the same reference numerals and the description thereof will be omitted.

Figures 16A, 16B:
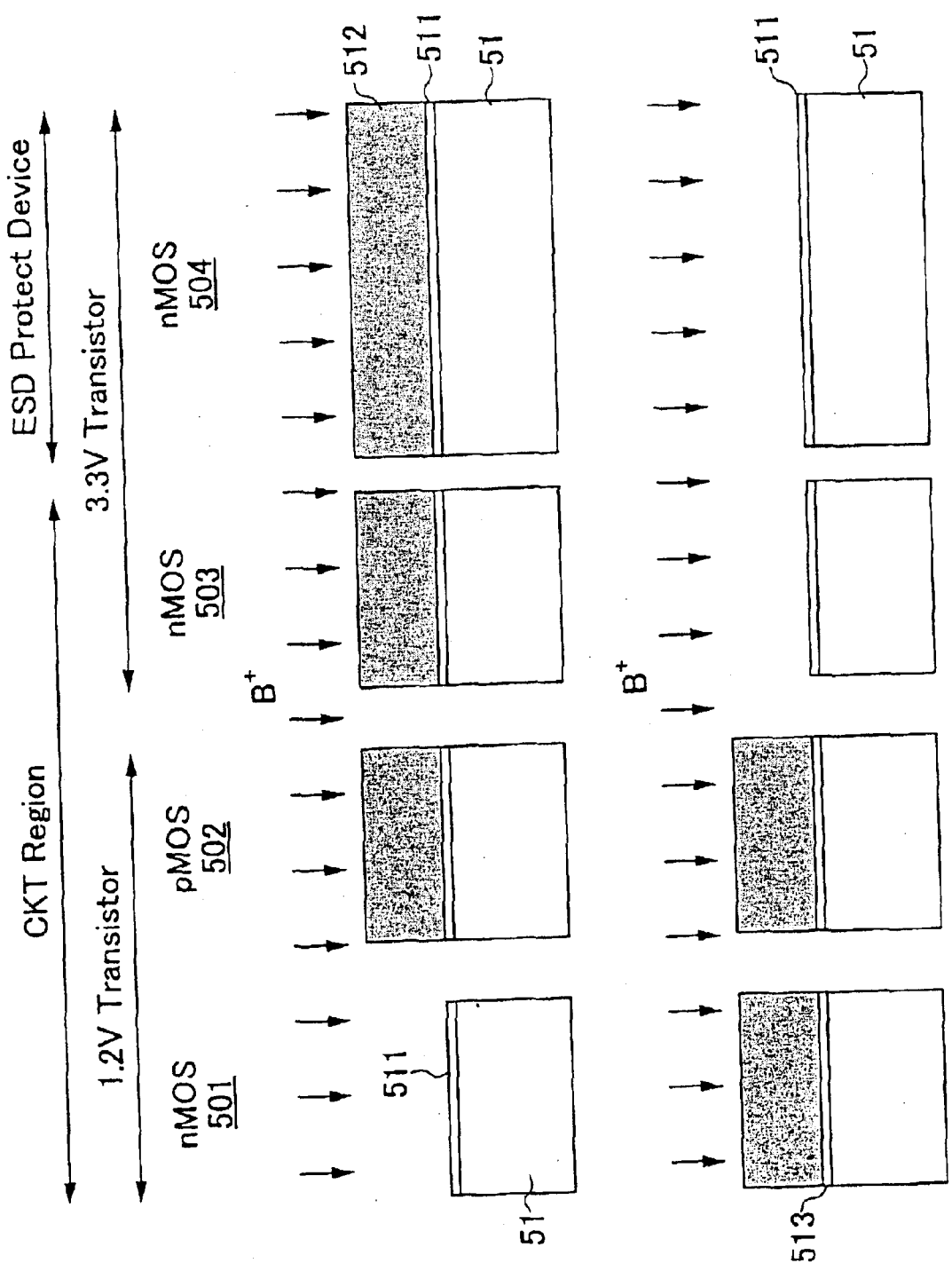

Referring to FIG. 16A, the p-type Si substrate 51 is covered with an oxide film 511 with a thickness of 10 nm, and ion implantation of B is conducted into the substrate 51 via the oxide film 511 in the state a device region 502 for the 1.2V p-channel MOS transistor, a device region 503 for the 3.3V n-channel MOS transistor and a device region 504 for the ESD-protection input/output circuit 50 are covered with a resist film 512. Thereby, a p-type well and a channel region are formed in the device region 501 of the 1.2V n-channel MOS transistor.

Next, in the step of FIG. 16B, the resist film 512 is removed, and the device region for the 1.2V n-channel MOS transistor and the device region for the 1.2V p-channel MOS transistor are covered with another resist film 513. In this state, ion implantation of B is conducted into the substrate 51 via the oxide film 511, and there are formed a p-type well and a channel region in the device region 503 of the 3.3V n-channel MOS transistor and further in the device region of the ESD-protection input/output circuit 504.

Further, in the step of FIG. 16C, the resist film 513 is removed and a resist film 514 is formed so as to expose the device region 502 of the 1.2V p-channel MOS transistor, and ion implantation of P and As is conducted into the Si substrate 51 via the oxide film 511. Thereby, a n-type well and a channel region are formed in the Si substrate 51 in correspondence to the device region 502.

Next, in the step of FIG. 16D, the resist film 514 and the oxide film 511 are removed, and a thermal oxide film is formed on the device region 501 for the 1.2V n-channel MOS transistor and the device region 502 for the 1.2V p-channel MOS transistor with a thickness of 1.8 nm as respective gate insulation films 521 and 522. Further, a thermal oxide film is formed on the device region 503 for the 3.3V n-channel MOS transistor and the device region 504 for the ESD-protection input/output circuit with a thickness of 7.5 nm as respective gate insulation films 523 and 52.

In the step of FIG. 16D, it should be noted that polysilicon gate electrode patterns 531 and 532 are formed respectively on the gate insulation films 521 and 522 in correspondence to the 1.2V n-channel MOS transistor and the 1.2V p-channel MOS transistor and a polysilicon gate electrode 533 is formed on the gate insulation film 523 in correspondence to the 3.3V n-channel MOS transistor. Thereby, it should be noted that the polysilicon gate electrode patterns 531–533 are formed simultaneously with a polysilicon gate pattern 53G of the ESD-protection input/output circuit 50 as a result of patterning of a common polysilicon film.

Figures 16E, 16F:
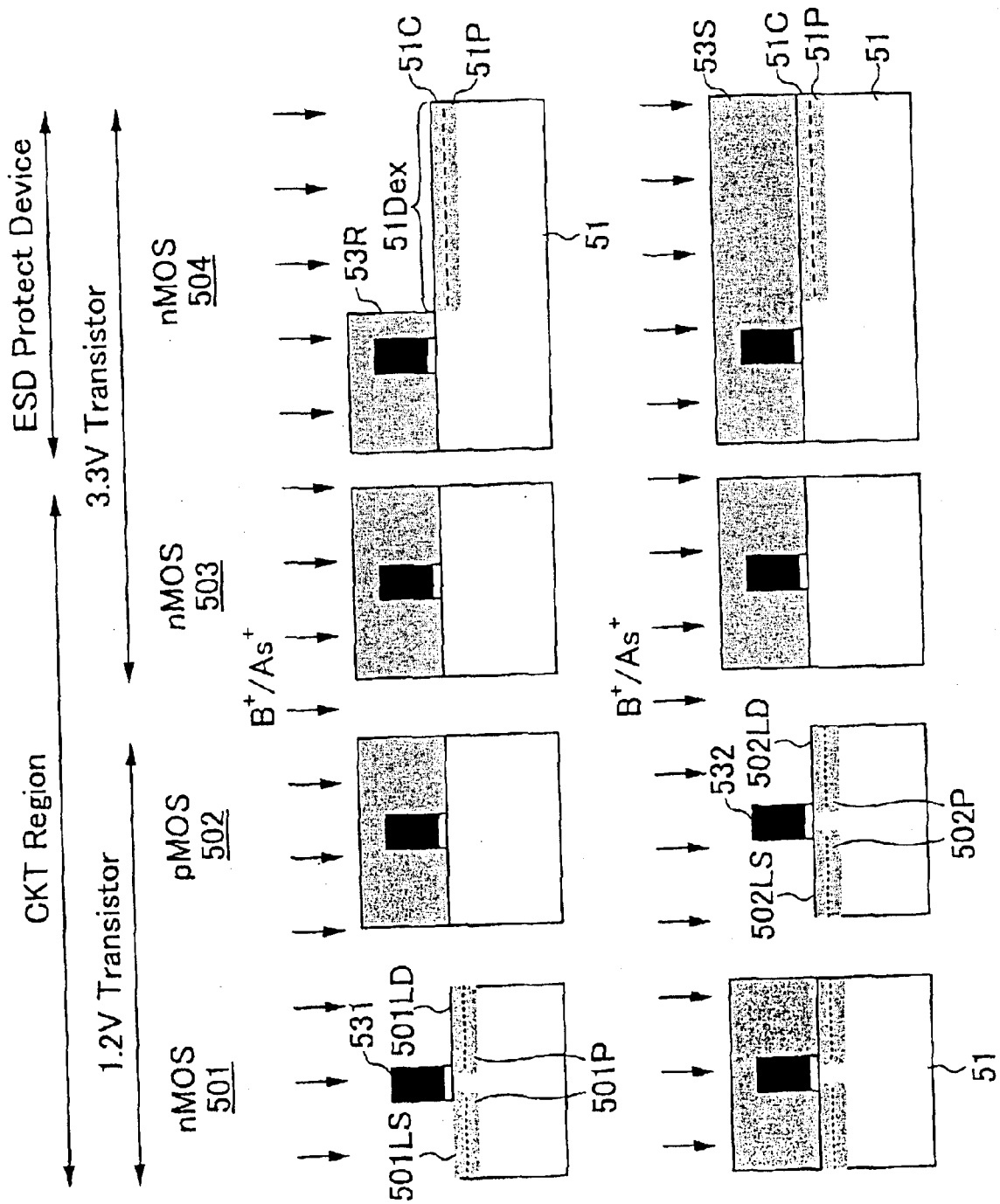

Next, in the step of FIG. 16E, the resist film 53R is formed on the structure of FIG. 16D such that the resist film 53R covers the device regions 502 and 503 and further the device region 504 except for part corresponding to the drain extension region 51Dex, and ion implantation of B and As are conducted respectively under the acceleration voltage of 10 keV and with the dose of $1 \times 10^{13}$ cm$^{-2}$ and under the acceleration voltage of 5 keV and with the dose of $2 \times 10^{14}$ cm$^{-2}$. As a result, the p-type diffusion region 51P and the n+-type diffusion region 51C are formed in the Si substrate 51 in correspondence to the drain extension region 51Dex, such that the n+-type diffusion region 51C is located above the p-type diffusion region 51P as explained before. Simultaneously, p-type diffusion regions 501P are formed in the device region 501 at both lateral sides of the polysilicon gate electrode pattern 531, followed by formation of the n+-type diffusion regions 501LS and 501LD also at both lateral sides of the gate electrode pattern 531. The n+-type diffusion regions 501LS and 501LD constitute source and drain extension regions of the 1.2V n-channel MOS transistor.

Next, in the step of FIG. 16F, the resist film 53R is removed and a new resist film 53S is formed such that the resist film 53S exposes the device region 502 while covering the Si substrate surface except for the foregoing device region 502. In the step of FIG. 16F, ion implantation of B is conducted under the acceleration voltage of 0.5 keV with a dose of $1.9 \times 10^{14}$ cm$^{-2}$ while using the resist film 53S as a mask, followed by ion implantation of As under the acceleration voltage of 80 keV with a dose of $8 \times 10^{12}$ cm$^{-2}$. As a result, n-type diffusion regions 502P are formed in the device region 502 at both lateral sides of the gate electrode 532, and p+-type diffusion regions 502LS and 502LD are formed further in the device region 502 at both lateral sides of the gate electrode 532. It should be noted that the diffusion regions 502LS and 502LD thus formed constitute the source and drain extension regions of the 1.2V p-channel MOS transistor formed in the device region 502.

Figure 16G:
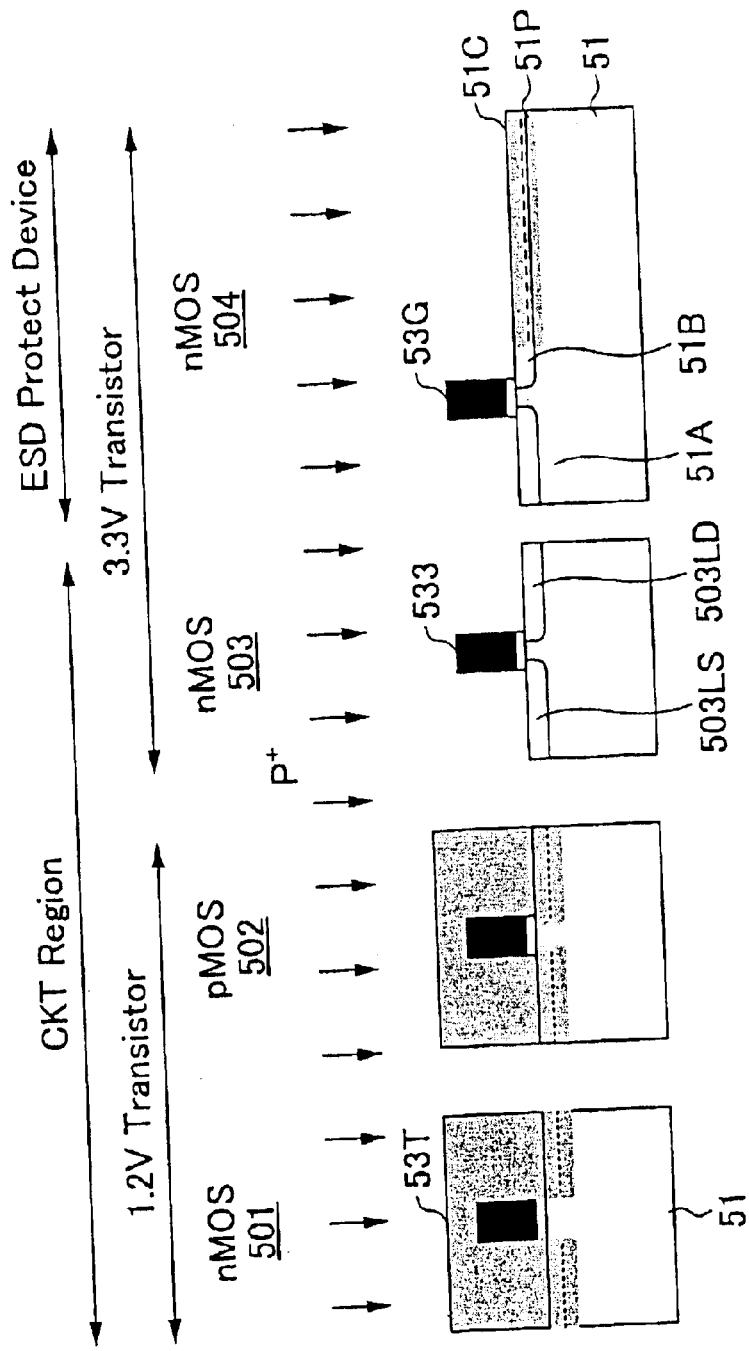

Next, in the step of FIG. 16G, the resist film 53S is removed, and a resist film 53T is formed such that the resist film 53T covers the device regions 501 and 502 and exposes the device regions 503 and 504.

In the step of FIG. 16G, ion implantation of P is conducted into the Si substrate 51 at the device regions 503 and 504 while using the resist film 53 as a mask, and there are formed diffusion regions 503LS and 503LD of n-type at both lateral sides of the gate electrode pattern 533 in the device region 503 as the LDD regions of the 3.3V n-channel MOS transistor in the device region 503.

Simultaneously, diffusion regions 51A and 51B of n-type are formed in the step of FIG. 16G in the Si substrate 51 in correspondence to the device region 504 at both lateral sides of the gate electrode pattern 53G, wherein it should be noted that the n-type diffusion region 51A constitutes the source region of the ESD-protection input/output circuit 50 while the n-type diffusion region 51B constitutes a drain extension region together with the n-type diffusion region 51C formed previously.

Next, in the step of FIG. 16H, an insulation film 54 such as an SiO2 film is deposited uniformly so as to cover the gate electrode pattern in each of the regions 501–504 of the Si substrate 51, and a resist pattern 54R is formed in the device region 504 in correspondence to the drain extension region as explained with reference to FIG. 15B.

In the step of FIG. 16H, the insulation film thus formed is etched in the direction perpendicular to the substrate 51 by a dry etching process while using the resist pattern 54R as a mask, until the substrate surface is exposed. As a result, sidewall insulation films are formed on each of the gate electrode patterns 531–533 and 53G as represented in FIG. 16I. Simultaneously with this, an insulation film pattern 54A is formed such that the insulation film pattern 54A covers the drain extension region.

In the step of FIG. 16I, the device region 502 is further covered with a resist pattern 53U, and ion implantation process of P is conducted under the acceleration voltage of 15 keV with a dose of $1.75 \times 10^{15}$ cm$^{-2}$. As a result, n-type source and drain regions 501S and 501D are formed in the Si substrate 51 at the outer sides of the sidewall insulation films in correspondence to the device region 501 respectively as the source region and the drain region of the 1.2V n-channel MOS transistor. During this ion implantation process, it should be noted that n-type diffusion regions 503S and 503D are formed in the Si substrate 51 in correspondence to the device region 503 at the outer sides of the sidewall insulation films respectively as the source region and the drain region of the 3.3V n-channel MOS transistor.

In this ion implantation process, it should be noted that the ion implantation process explained with reference to FIG. 15C is conducted, and n-type diffusion regions 51D, 51E and 51E$_1$ are formed.

Figures 16J, 16K:
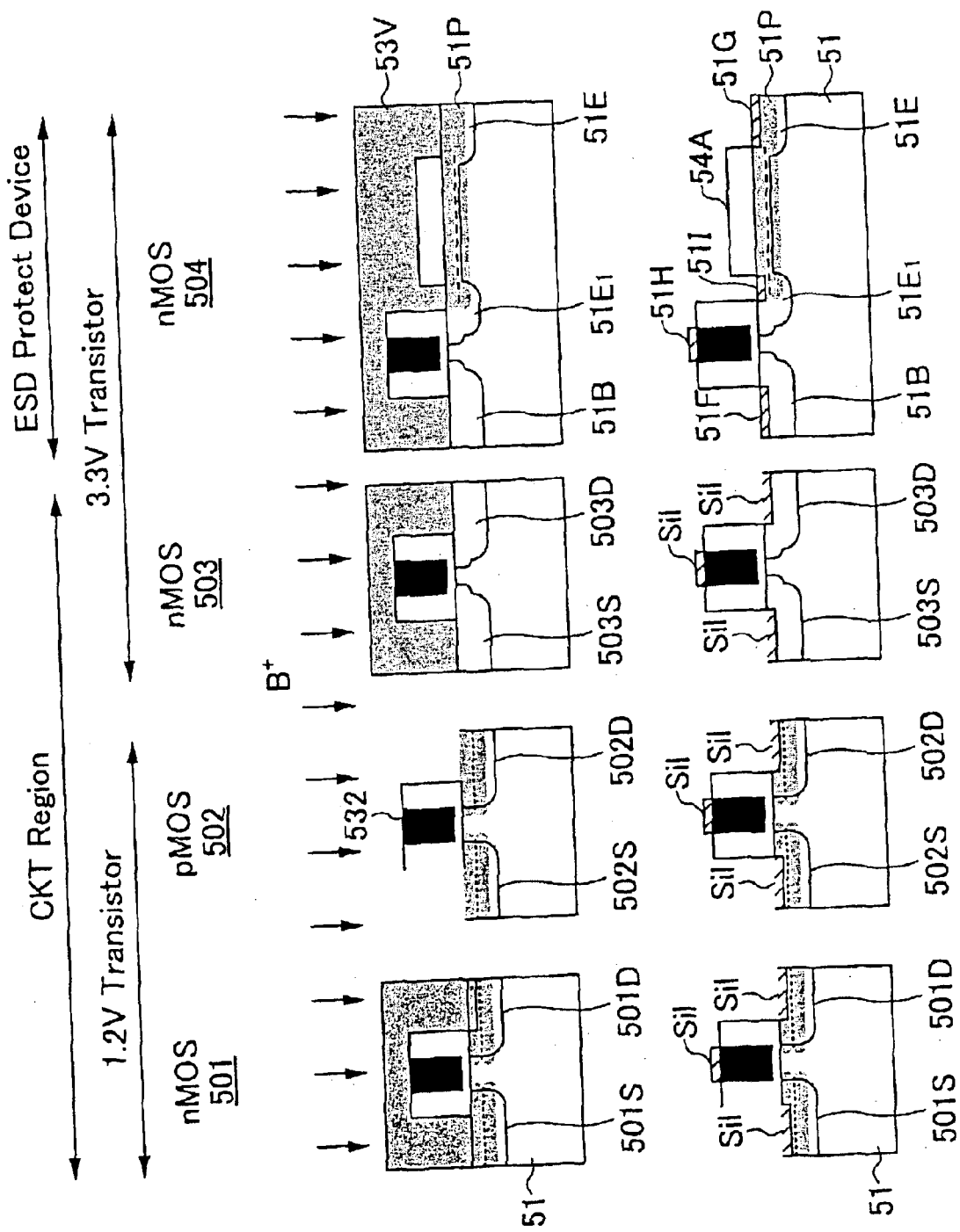

Next, in the step of FIG. 16J, the device regions 501, 503 and 504 are covered by a resist film 53V such that only the device region 502 is exposed. Further, by conducting ion implantation of B into the Si substrate 51 under the acceleration voltage of 5 keV with a dose of $2 \times 10^{15}$ cm$^{-2}$, there are formed p-type diffusion regions 502S and 502D at outer sides of the sidewall insulation films respectively as the source region and the drain region of the 1.2V p-channel MOS transistor.

Next, in the step of FIG. 16K, the resist film 53V is removed, and a metal film such as a Co film is deposited.

After conducting a thermal annealing process for a short time, there is formed a low-resistance silicide layer SiI that includes also the silicide layers 51F, 51G, 51H and 51I on the exposed silicon surface. In the step of FIG. 16K, it should be noted that the insulation film pattern 54A functions as a silicide block suppressing silicide formation in the drain extension region.

As can be seen from FIGS. 16A–16K, the present embodiment can form 1.2V MOS transistors or 3.3V MOS transistors inside a semiconductor integrated circuit at the same time the ESD-protection input/output circuit 50 is formed. Further, it should be noted that the foregoing process of the present invention does not require additional resist steps except for the step of forming the resist pattern 54R in the step of FIG. 16H for forming the silicide block pattern 54A. Thus, the present invention can minimize the increase of cost for formation of the ESD-protection input/output circuit.

Figure 17:
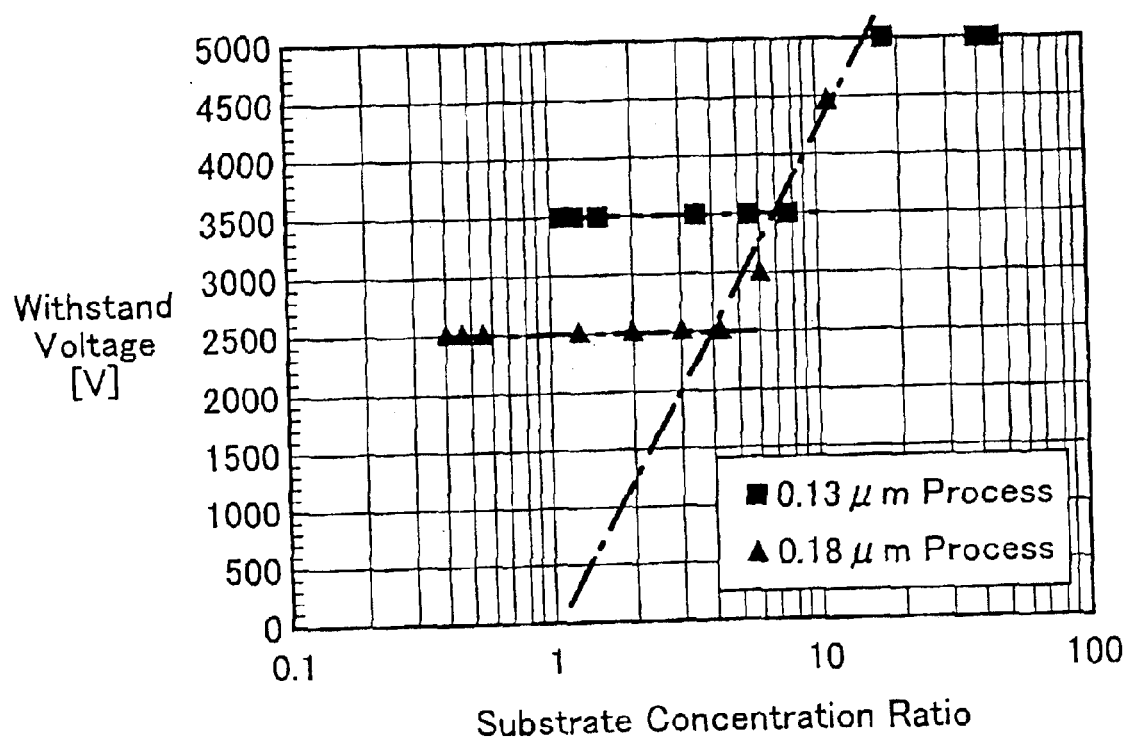
FIG. 17 is a diagram showing the breakdown characteristics of the ESD-protection circuit of the fifth embodiment of the present invention.

FIG. 17 shows the result of simulation conducted on the ESD-protection input/output circuit 50 thus formed with regard to the ESD resistance while changing the ion implantation dose in the step of FIG. 16E of introducing the B ions.

In the simulation of FIG. 17, a surge voltage similar to the one used in the actual ESD test is applied to the ESD-protection input/output circuit 50 and evaluation is made on the withstand voltage of the circuit 50. Here, thermal destruction of the circuit 50 is defined as the state in which the temperature of the Si substrate 51 has reached the melting point of Si.

In FIG. 17, it should be noted that the vertical axis represents the ESD withstand voltage for the HBM (human body model) test while the horizontal axis represents the substrate concentration ratio at the bottom edge of the drain junction represented in FIG. 14D or FIG. 15D by a broken line. More specifically, the substrate concentration ratio is defined as a ratio of the B concentration at the foregoing drain junction bottom edge to the B concentration of the region right underneath the gate electrode at the depth generally identical with the depth of the foregoing drain junction bottom edge. In the case the p-type diffusion region 51P is not formed, this ratio takes the value of 1. In FIG. 17, it should be noted that ▲ represent the case in which the ESD-protection input/output circuit 50 is formed with the 0.18 μm rule, while ■ represent the case in which the ESD-protection input/output circuit 50 is formed under the 0.13 μm rule.

Referring to FIG. 17, it can be seen that there is a slight difference of withstand voltage between the device of the 0.13 μm process and the device of the 0.18 μm process in the range of the substrate concentration ratio of 1–10, while this difference is caused merely by the difference of the conditions other than the substrate concentration ratio. In FIG. 22, it will be noted that the there occurs a sharp increase of ESD withstand voltage in the device of the 0.13 μm process when the substrate concentration ratio exceeds 8 as represented by a one-dotted line. Further, it can be seen that a similar sharp increase of the withstand voltage occurs in the device of the 0.18 μm device when the substrate concentration ratio exceeds 5, wherein it should be noted that the increase of the ESD withstand voltage for the 0.18 μm device is aligned on the same one-dotted line for the 0.13 μm device. This obviously reflects the avalanche breakdown taking place at the p-n junction interface represented by the broken line in the foregoing drawings.

From the extrapolation of the one-dotted line, it can be seen that an improvement of ESD-withstand voltage is achieved when the substrate concentration ratio has exceeded 1, in other words, when the p-type diffusion region 51P is formed with an impurity concentration level higher than the impurity concentration level of the p-type Si substrate 51.

[SIXTH EMBODIMENT]

Figure 7:
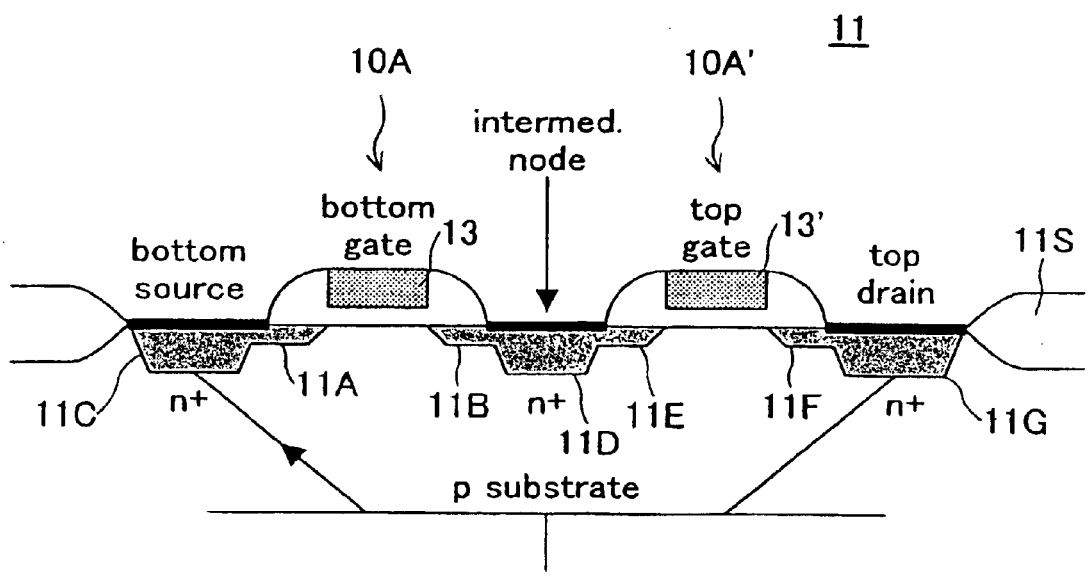
FIG. 7 is a diagram showing the conventional ESD-protection circuit having a cascade construction in a cross-sectional view.

FIGS. 18A–18D show the example in which the present invention is applied to an ESD-protection input/output circuit having a cascaded structure explained with reference to FIG. 7. In the drawings, those parts corresponding to the parts explained previously are designated by the same reference numerals and the description thereof will be omitted.

Referring to FIG. 18A, it will be noted that the present embodiment is a modification of the embodiment of FIGS. 13A–13D in that there is provided another polysilicon gate electrode pattern 43' on the p-type Si substrate 41 across the n-type diffusion region 41A in the state that the same gate insulation film 42 is interposed between the gate electrode pattern 43' and the Si substrate 41. By conducting ion implantation of P under the acceleration voltage of 20 keV with the dose of $4 \times 10^{13}$ cm$^{-2}$ while using the polysilicon gate electrode patterns 43 and 43' as a mask, there are formed n-type diffusion regions 41A and 41B at both lateral sides of the gate electrode 43. Further, an n-type diffusion region 41A' is formed at the source side of the gate electrode pattern 43'.

In the step of FIG. 18A, it should further be noted that the resist pattern 43R is formed such that the resist pattern 43R exposes the part corresponding to the drain extension region 41B, and ion implantation of B is conducted under the acceleration voltage of 60 keV with a dose of $3.5 \times 10^{13}$ cm$^{-2}$ while using the resist pattern 43R as a mask. As a result, the diffusion region 41P of p-type is formed underneath the n-type diffusion region 41B. While not shown, it should be noted that it is also possible to form a very shallow n+-type region on the surface of the drain extension region 41B by conducting an ion implantation process of As under the acceleration voltage of 10 kev with a dose of $6 \times 10^{13}$ cm$^{-2}$ and P under the acceleration voltage of 10 keV with a dose of $1 \times 10^{13}$ cm$^{-2}$.

Next, in the step of FIG. 18B, the resist pattern 43R is removed and an insulation film 44such as an SiO$_2$ film is formed on the Si substrate 41 so as to cover the gate electrode patterns 43 and 43' uniformly. In the step of FIG. 18B, the resist pattern 44R is formed further on the insulation film 44, wherein the insulation film 44 thus formed is patterned in the step of FIG. 18C while using the resist pattern 43R as a mask. As a result, the source region is exposed at the source side of the gate electrode pattern 43' with a distance corresponding to the sidewall insulation film. Further, the drain region is exposed at the drain side of the gate electrode 43 with a distance corresponding to the sidewall insulation film and the drain extension region.

In the step of FIG. 18C, it should further be noted that ion implantation process of As is conducted into the source region and the drain region thus exposed under an acceleration voltage of 40 keV with a dose of $2 \times 10^{15}$ cm$^{-2}$ while using the insulation film pattern 44A patterned in the step of FIG. 18C as a mask, and the n+-type diffusion regions 41D and 41E are formed after conducting a rapid thermal annealing process at 1000° C. for 20 seconds.

Further, in the step of FIG. 18D, the silicide films 41F and 41G are formed respectively on the source region 41D and the drain region 41E. In the step of xxFIG. 18D, it should be noted that the insulation film pattern 44A functions as a silicide block pattern.

Of course, such an ESD-protection input/output circuit of cascaded construction can be formed also by using a device other than the device 40 of FIGS. 13A–13D such as the device 30 or 50 explained before.

Figure 19:
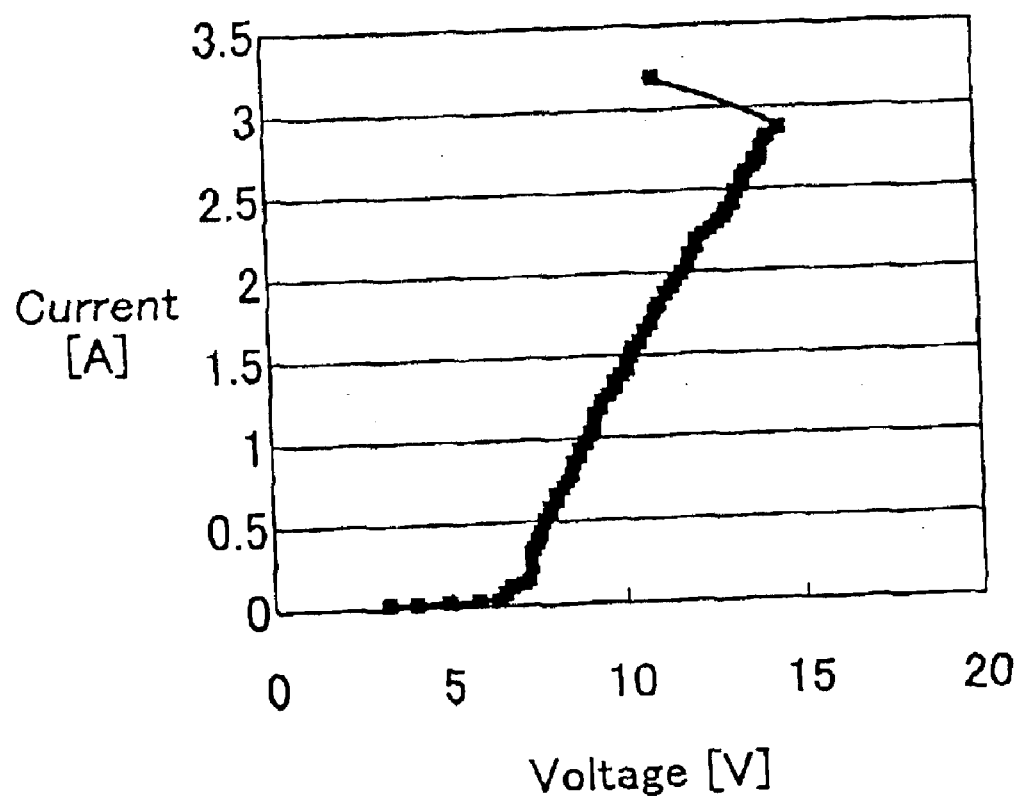
FIG. 19 is a diagram showing the electric discharge characteristics of the ESD protection circuit of the second embodiment.

FIG. 19 shows an example of the voltage-current characteristics of the ESD-protection input/output circuit 30 of FIG. 18D.

Referring to FIG. 19, it can be seen that there starts electric discharge when the surge voltage to the drain region 41G has exceeded 6V, and the rate of increase of the surge voltage is reduced. When the surge voltage has increased further and exceeded about 7V, the lateral bipolar transistor causes conduction, and a large discharge current flows between the source region 41D and the drain region 41E. With this, increase rate of the surge voltage is further suppressed. When the surge voltage has been increased further, there starts decrease of discharge voltage at the voltage of about 15V, indicating that the device has been destroyed.

Figure 20A:
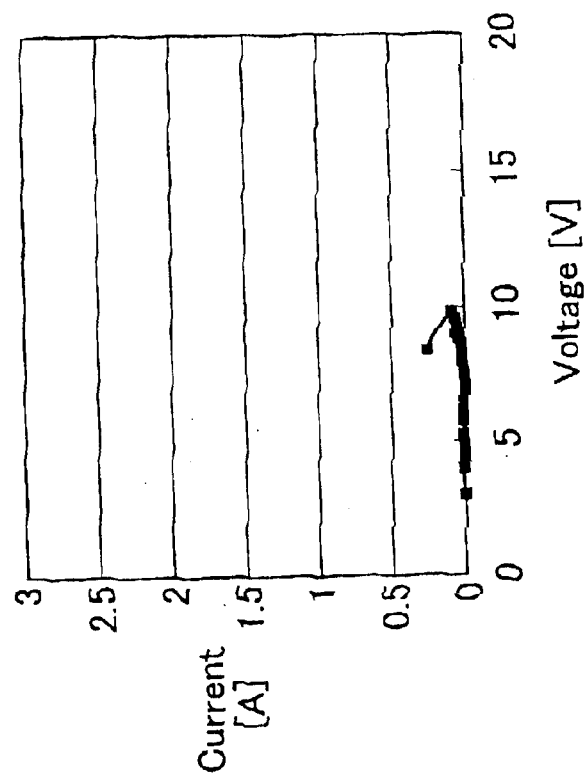
FIGS. 20A and 20B are diagrams showing the electric discharge characteristics respectively for the case in which no silicide block formation was made and in which no p-type diffusion region was formed.

On the other hand, FIG. 20A shows the electric discharge characteristics of the ESD-protection input/output circuit 60 of exactly identical construction for the case the silicide block pattern 44A is not provided. In this case, it should be noted that the silicide layer is formed on the surface of the Si substrate 41 up to the position of the gate sidewall insulation film because of the absence of the silicide block pattern 44A.

Referring to FIG. 20A, it can be seen that the electric discharge current corresponding to the point of destruction of the device is reduced significantly, indicating that the device has a poor performance as an ESD-protection circuit.

Figure 20B:
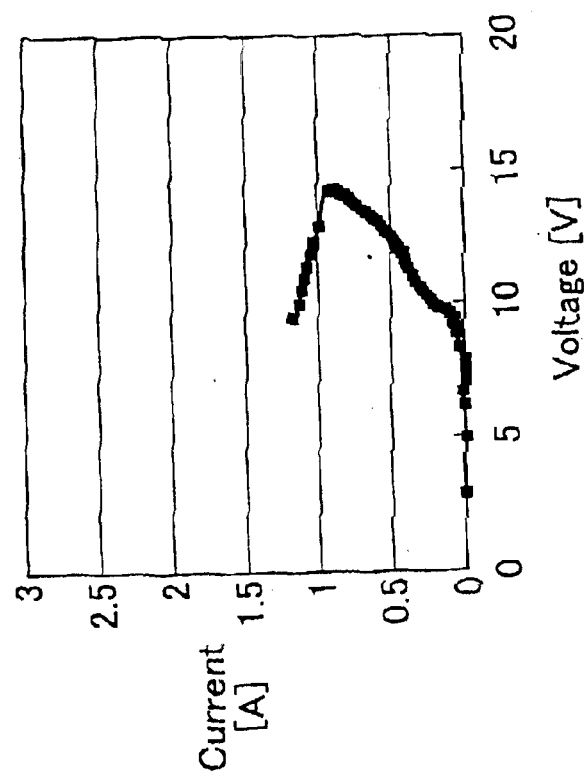

FIG. 20B shows the characteristic for the case in which not only the silicide block pattern 44A but also the p-type diffusion region 41P are omitted in the structure of FIG. 18D.

As can be seen from FIG. 20B, the device is destroyed without forming discharge current. Further, it can be seen that the destruction takes place at a very low surge voltage of about 10V.

[SEVENTH EMBODIMENT]

Meanwhile, it should be noted that there occurs variation of ESD withstand voltage in such an ESD-protection input/output circuit depending on the existence or no existence or type of the silicide block pattern and further on the impurity concentration level of the p-type diffusion region 41P.

Figure 21A:
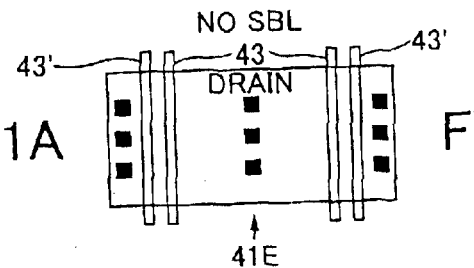
FIGS. 21A–21H are diagrams showing various silicide block patterns used in the ESD-protection circuit of the sixth embodiment having the cascade construction.
Figure 21E:
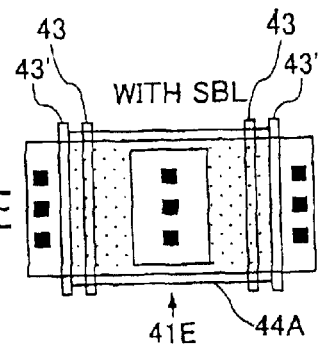
Figure 21B:
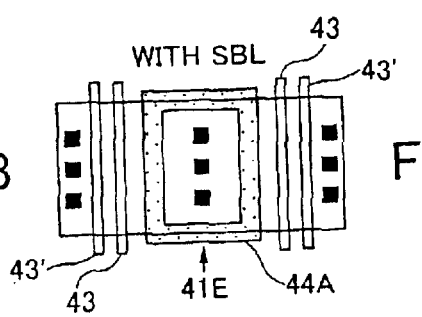
Figure 21F:
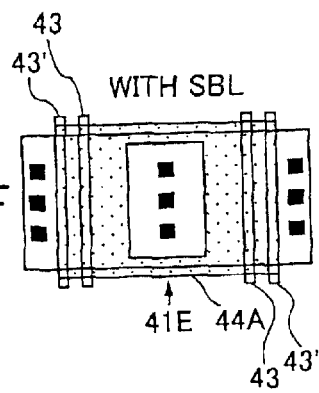
Figure 21C:
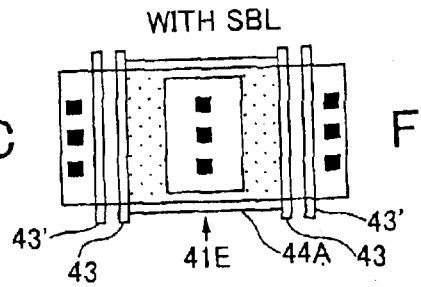
Figure 21G:
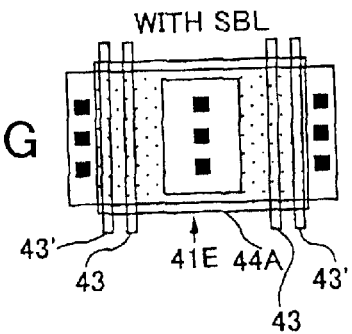
Figure 21D:
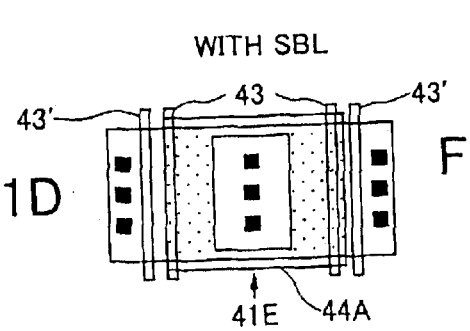
Figure 21H:
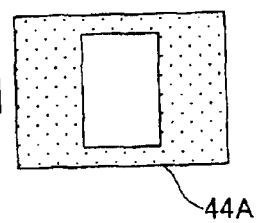

Thus, in the present embodiment, the silicide block pattern 44A shown in FIG. 21H is changed as represented in FIGS. 21A–21G in the cascaded ESD-protection input/output circuit having the construction of FIG. 18D. Further, the acceleration voltage (energy) and the dose of the ion implantation process of B of FIG. 18A is changed as represented in Table 1 below, and the ESD withstand voltage is evaluated for a real device. In the construction of FIGS. 21A–21G, it should be noted that two structures each having the construction of FIG. 18A and having the gate electrodes 43 and 43' are formed in a device region defined by a device isolation structure in a symmetric manner with regard to the drain region 41E.

TABLE 1

| B+ii condition | energy | dose (/cm²) | LNPN point (V) |
|---|---|---|---|
| No. 1 | 60 keV | 2E + 13 | 8.0 |
| No. 2 | 60 keV | 3E + 13 | 7.2 |
| No. 3 | 60 keV | 4.5E + 13 | 6.5 |
| No. 4 | 80 keV | 1E + 13 | 9.5 |
| No. 5 | 80 keV | 3E + 13 | 7.7 |
| No. 6 | 80 keV | 5E + 13 | 7.0 |

Here, it should be noted that FIG. 21A corresponds to the case in which the silicide block pattern 44A of FIG. 21H is not formed, and thus, the silicide layer is formed up to the position of the sidewall insulation film of the gate electrode patterns 43 and 43'. In other examples, the location and size of the silicide layer are changed variously. In the drawings, the mat regions represent the part in which the silicide formation is suppressed. Of course, the regions immediately adjacent to the gate electrodes 43 and 43' are covered by the sidewall insulation films and no silicide formation is made in such regions.

In the example of FIG. 21B, it can be seen there exists a region in which no silicide block 44A is formed in the part from the drain region 41E to the first polysilicon gate electrode pattern 43, while in the example of FIG. 21C, the silicide block is formed on the entire region from the drain region 41E to the gate electrode pattern 43. In the example of FIG. 21C, on the other hand, no suicide block is formed in the region between the gate electrode pattern 43 and the gate electrode pattern 43'.

In the example of FIG. 21D, the entire region from the drain region 41E to the gate electrode pattern 43 is formed with the silicide block. On the other hand, the part between the gate electrode pattern 43 and the gate electrode pattern 43' is not entirely covered with the silicide block pattern.

In the example of FIG. 21E, the entire region from the drain region 41E to the gate electrode pattern 43 is formed with the silicide block pattern, and the entire region between the gate electrode pattern 43 and the gate electrode pattern 43' is covered with the silicide block pattern. On the other hand, in the example of FIG. 21E, the gate electrode pattern 43' itself is not covered with the silicide block pattern.

FIG. 21F shows the example in which the entire region from the drain region 41E to the gate electrode pattern 43 is formed with the silicide block, and the entire region between the gate electrode pattern 43 and the gate electrode pattern 43' is also formed with the silicide block. Further, the gate electrode pattern 43' itself is covered by the silicide block, while the source side of the gate electrode pattern 43' is not covered by the silicide block.

Further, FIG. 21G shows the example in which the silicide block is formed also on the source side of gate electrode pattern 43' just excluding the source contact region.

It should be noted that Table 1 also represents the operational voltage or operational point Vt1 of the lateral bipolar transistor (LNPN) for each of the B ion implantation conditions. The operational point does not depend on the silicide block pattern represented in FIGS. 21A–21H.

As can be seen from Table 1, the acceleration voltage is set to 60 keV in the conditions 1–3 wherein the ion implantation dose is increased from $2\times10^{13}$ cm² to $4.5\times10^{13}$ cm$^{-2}$, consecutively. In the conditions 4–6, on the other hand, the acceleration voltage is set to 80 keV and the ion implantation dose is increased consecutively from $1\times10^{13}$ cm$^{-2}$ to $5\times10^{13}$ cm$^{-2}$.

Tables 2 and 3 below show the withstand voltage of the ESD-protection input/output circuit obtained for the construction of FIGS. 21A–21G in combination with the ion implantation conditions of Table 1, wherein Table 2 shows the withstand voltage for the MM (machine model) test, while Table 3 shows the withstand voltage for the HBM test.

TABLE 2

| | structure | no B + II | No. 1 | No. 2 | No. 3 | No. 4 | No. 5 | No. 6 |
|---|---|---|---|---|---|---|---|---|
| FIG. 21A | no SLB | 20 V | 20 V | 20 V | 20 V | 20 V | 20 V | 20 V |
| FIG. 21B | with SLB | 60 V | 220 V | ≧400 V | ≧400 V | 60 V | ≧400 V | ≧400 V |
| FIG. 21C | with SLB | 120 V | 380 V | ≧400 V | ≧400 V | 260 V | ≧400 V | ≧400 V |
| FIG. 21D | with SLB | 100 V | 400 V | ≧400 V | ≧400 V | 240 V | ≧400 V | ≧400 V |
| FIG. 21E | with SLB | 140 V | 400 V | ≧400 V | ≧400 V | 260 V | ≧400 V | ≧400 V |
| FTG. 21F | with SLB | 100 V | 380 V | ≧400 V | ≧400 V | 260 V | ≧400 V | ≧400 V |
| FIG. 21G | with SLB | 120 V | 400 V | ≧400 V | ≧400 V | 260 V | ≧400 V | ≧400 V |
| LNPN point | | 10.0 | 8.0 | 7.2 | 6.5 | 9.5 | 7.7 | 7.0 |

TABLE 3

| | structure | no B + II | No. 1 | No. 2 | No. 3 | No. 4 | No. 5 | No. 6 |
|---|---|---|---|---|---|---|---|---|
| FIG. 21A | no SLB | 200 V | 20 V | 400 V | 400 V | 200 V | 200 V | 300 V |
| FIG. 21B | with SLB | 300 V | 800 V | 2000 V | ≧3000 V | 300 V | 800 V | 2200 V |
| FIG. 21C | with SLB | 1400 V | ≧3000 V | ≧3000 V | ≧3000 V | 2500 V | ≧3000 V | ≧3000 V |
| FIG. 21D | with SLB | 1300 V | ≧3000 V | ≧3000 V | ≧3000 V | 2600 V | ≧3000 V | ≧3000 V |
| FIG. 21E | with SLB | 1300 V | ≧3000 V | ≧3000 V | ≧3000 V | 2500 V | ≧3000 V | ≧3000 V |
| FIG. 21F | with SLB | 1400 V | ≧3000 V | ≧3000 V | ≧3000 V | 2600 V | ≧3000 V | ≧3000 V |
| FIG. 21G | with SLB | 1400 V | ≧3000 V | ≧3000 V | ≧3000 V | 2500 V | ≧3000 V | ≧3000 V |
| LNPN point | | 10.0 | 8.0 | 7.2 | 6.5 | 9.5 | 7.7 | 7.0 |

Referring to Tables 2 and 3, it can be seen that a withstand voltage of about 20V in terms of the MM test or a withstand voltage of less than 400V in terms of the HBM test is achieved in the case the silicide block (SBL) pattern 44A is not formed. In the case the silicide block pattern is formed but the ion implantation of B is not conducted as in the case of FIG. 18A, it can be seen that only an unsatisfactory withstand voltage of 140V or less in terms of the MM test or a withstand voltage of 1400V or less in terms of the HBM test is achieved.

Further, in the case the silicide block structure of any of FIGS. 21B–21G is used but the ion implantation dose of B is small as in the case of condition 4 of Table 2, only unsatisfactory withstand voltage is obtained.

In the ESD-protection input/output circuit of FIG. 21B, on the other hand, it can be seen that a withstand voltage of 300V or more can be achieved successfully except for the condition 1 in which the ion implantation dose of B is small. In terms of the HBM test, it can be seen that the desired withstand voltage of 3000V or more is achieved in the ESD-protection input/output circuit of FIG. 21B for the case of condition 3 that uses a large ion implantation dose.

Further, it can be seen that the withstand voltage of 300V or more in terms of the MM test and the withstand voltage of 3000V or more in terms of the HBM test are achieved also in other constructions except for the ion implantation conditions 1 and 4.

Thus, the present invention can realize the desired ESD withstand voltage also in the case of the cascaded ESD-protection input/output circuit, by forming the p-type diffusion region 41P underneath the drain extension region and by suppressing the silicide formation in the drain extension region by forming thereon a silicide block pattern.

Further, the present invention is not limited to the embodiments described heretofore, but various variations and modifications may be made without departing from the scope of the invention.

What is claimed is:

1. A semiconductor device, comprising:
    a substrate;
    a gate electrode formed on said substrate;
    a first diffusion region of a first conductivity type formed in said substrate at a first side of said gate electrode;
    a second diffusion region of said first conductivity type formed in said substrate at a second side of said gate electrode; and
    a third diffusion region of a second conductivity type formed in said substrate underneath said second diffusion region in contact with said second diffusion region, said third diffusion region containing an impurity element of said second conductivity type with a concentration level larger than a concentration level of an impurity element of said second conductivity type contained in a region right underneath said gate electrode when comparison is made at the same depth in said substrate, said gate electrode having side wall insulation films at respective sidewall surfaces thereof, said sidewall insulation films extending from a top part of said gate electrode down to a bottom part of said gate electrode at respective sidewall surfaces.

2. The semiconductor device as claimed in claim 1, wherein said substrate is a p-type Si substrate, said first and second diffusion regions have an n-type conductivity, and wherein said third diffusion region has a p-type conductivity.

3. The semiconductor device as claimed in claim 1, wherein said impurity element has a concentration level in said third diffusion region such that the concentration level of said impurity element is larger than a concentration level of an impurity element of said second conductivity type in a region right underneath said gate electrode by a factor of five or more.

4. The semiconductor device as claimed in claim 1, wherein said impurity element has a concentration level in said third diffusion region such that the concentration level of said impurity element is larger than a concentration level of an impurity element of said second conductivity type in a region right underneath said gate electrode by a factor of eight or more.

5. The semiconductor device as claimed in claim 1, wherein a silicide layer is formed on a surface of said second diffusion region with a separation from a sidewall insulation film provided on a sidewall of said gate electrode at said second side.

6. The semiconductor device as claimed in claim 5, wherein an insulation film pattern is provided on said substrate in continuation from said sidewall insulation film up to a region where said silicide layer is formed.

7. The semiconductor device as claimed in claim 6, wherein a drain region of said first conductivity type is formed in said substrate in correspondence to the part on which said silicide layer is formed.

8. The semiconductor device as claimed in claim 5, wherein an insulation film pattern is provided on said substrate at said second side of said gate electrode with a separation from said sidewall insulation film, said semiconductor device further comprising a first silicide region formed on a surface of said second diffusion region at said second side of said insulation film pattern in correspondence to a tip end thereof, a second silicide region formed between said sidewall insulation film and said sidewall insulation pattern, a drain region of said first conductivity type formed in said substrate underneath said first silicide region, and another diffusion region of said first conductivity type formed in said substrate underneath said second silicide region.

9. The semiconductor device as claimed in claim 1, wherein a silicide layer is formed on said gate electrode.

10. A semiconductor device, comprising:
    a substrate;
    a first gate electrode formed on said substrate;
    a first diffusion region of a first conductivity type formed in said substrate at a first side of said gate electrode;
    a second diffusion region of said first conductivity type formed in said substrate at a second side of said first gate electrode;
    a third diffusion region of a second conductivity type formed in said substrate underneath said second diffusion region in contact with said second diffusion region;
    a second gate electrode formed on said substrate at said first side of said gate electrode across said first diffusion region; and
    a fourth diffusion region of said first conductivity type formed in said substrate at said first side of said second gate electrode,
    said third diffusion region containing an impurity element of said second conductivity type with a concentration larger than a concentration of an impurity element of said second conductivity type in a region right underneath said gate electrode when comparison is made at the same depth in said substrates,
    wherein said substrate is a substrate of said second conductivity type, and
    wherein said third diffusion layer contacts only with a bottom part of said second diffusion layer.

11. The semiconductor device as claimed in claim 10, wherein an insulation film extends over a surface of said substrate at said second side of said first gate electrode in continuation from a sidewall insulation film covering a sidewall surface of said first gate electrode at said second side, a drain region of said first conductivity type is formed in said substrate in correspondence to a tip end of said insulation film, and a silicide layer is formed on said substrate surface in correspondence to said drain region.

12. A method of fabricating a semiconductor device, comprising the steps of:
    forming first and second diffusion regions of a first conductivity type in a substrate by introducing a first impurity element of said first conductivity type into said substrate by an ion implantation process while using a gate electrode pattern as a mask, such that said first and second diffusion regions are formed respectively at a first side and a second side of said gate electrode;
    forming third and fourth diffusion regions of a second conductivity type in said substrate respectively underneath said first and second diffusion regions by introducing a second impurity element of said first conductivity type and a third impurity element of said second conductivity type into said substrate by an ion implantation process while using said gate electrode pattern and sidewall insulation films formed at both lateral sidewall surfaces of said gate electrode as a mask; and
    forming a silicide layer on a surface of said first and second diffusion regions,
    said step of forming said third and fourth diffusion regions being conducted by covering said gate electrode pattern by a resist pattern.

13. A fabrication process of a semiconductor device, comprising the steps of:
    forming first and second diffusion regions of a first conductivity type by introducing a first impurity element of said first conductivity type into a substrate by an ion implantation process while using a gate electrode pattern as a mask, such that said first and second diffusion regions are formed respectively at a first side and a second side of said gate electrode;
    forming third and fourth diffusion regions of said first conductivity type respectively underneath said first and second diffusion regions by introducing a second impurity element of said first conductivity type and a third impurity element of a second conductivity type into said substrate by an ion implantation process while using said gate electrode pattern and sidewall insulation films formed at both lateral sidewall surfaces of said gate electrode as a mask;
    forming an insulation film pattern on said substrate at said second side of said gate electrode such that said insulation film pattern extends along a surface of said substrate in the direction of said second side; and
    forming a silicide layer on said surface of said substrate at a tip end part of said insulation film pattern while using said insulation film pattern as a mask,
    wherein said substrate is a substrate of said second conductivity type, and
    wherein said third diffusion layer contacts only with a bottom part of said second diffusion layer.

14. The method of fabricating a semiconductor device, comprising the steps of:
    forming first and second diffusion regions of a first conductivity type by introducing a first impurity element of said first conductivity type into a substrate by an ion implantation process while using a gate electrode pattern as a mask, such that said first and second diffusion regions are formed respectively at a first side and a second side of said gate electrode;
    forming a third diffusion region of a second conductivity type in said substrate in a region in which said second diffusion region is formed by introducing an impurity element of said second conductivity type, such that said third diffusion region is located at a depth deeper than a depth of said second diffusion region;

forming a fourth diffusion region in said substrate in said region in which said second diffusion region is formed by introducing an impurity element of said first conductivity type, such that said fourth diffusion region is located at a depth shallower than a depth of said second diffusion region;

forming an insulation film pattern on said substrate at said second side of said gate electrode such that said insulation film pattern extends in the direction of said second side along a surface of said substrate; and forming a silicide layer on said surface of said substrate at a tip end part of said insulation film pattern while using said insulation film pattern as a mask, wherein said substrate is a substrate of said second conductivity type, and wherein said third diffusion layer contacts only with a bottom part of said second diffusion layer.

15. The method as claimed in claim 14, further comprising the step, after said step of forming said insulation film pattern, of forming a diffusion region of said first conductivity type as a drain region by introducing an impurity element of said first conductivity type into said substrate.

16. An ESD-protection device, comprising:

a substrate;

a semiconductor device formed on said substrate, said semiconductor device comprising: a gate electrode formed on said substrate; a first diffusion region of a first conductivity type formed in said substrate at a first side of said gate electrode; a second diffusion region of said first conductivity type formed in said substrate at a second side of said gate electrode; and a third diffusion region of a second conductivity type formed in said substrate underneath said second diffusion region in contact with said second diffusion region, said third diffusion region containing an impurity element of said second conductivity type with a concentration level larger than a concentration level of an impurity element of said second conductivity type contained in a region right underneath said gate electrode when comparison is made at the same depth in said substrate; and an electrode pad provided on said substrate in electrical connection with said second diffusion region, said gate electrode pattern and said first diffusion region being connected to a power supply line, wherein said substrate is a substrate of said second conductivity type, and wherein said third diffusion layer contacts only with a bottom part of said second diffusion layer.

* * * * *